US011290695B2

(12) United States Patent
Ota et al.

(10) Patent No.: US 11,290,695 B2
(45) Date of Patent: Mar. 29, 2022

(54) CONTROL DEVICE, MULTI-PROJECTION SYSTEM AND CONTROL METHOD OF CONTROL DEVICE

(71) Applicant: SEIKO EPSON CORPORATION, Tokyo (JP)

(72) Inventors: Akihiko Ota, Matsumoto (JP); Yusuke Kudo, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/136,614

(22) Filed: Dec. 29, 2020

(65) Prior Publication Data

US 2021/0132118 A1    May 6, 2021

Related U.S. Application Data

(63) Continuation of application No. 16/553,703, filed on Aug. 28, 2019, now Pat. No. 10,911,728.

(30) Foreign Application Priority Data

Aug. 29, 2018 (JP) .............................. JP2018-160070

(51) Int. Cl.
*G03B 21/14* (2006.01)
*H04N 9/31* (2006.01)
(Continued)

(52) U.S. Cl.
CPC ........... *H04N 9/3147* (2013.01); *G01R 11/24* (2013.01); *G01R 21/06* (2013.01);
(Continued)

(58) Field of Classification Search
CPC ...... G03B 21/14; G03B 21/13; G03B 21/005; G03B 21/006; G03B 21/008; H04N 9/31; H04N 9/4122
(Continued)

(56) References Cited

U.S. PATENT DOCUMENTS 8,711,213 B2    4/2014    Furui
9,906,761 B2    2/2018    Mori
(Continued)

FOREIGN PATENT DOCUMENTS

JP    2011-221455 A    11/2011
JP    2013-117631 A    6/2013
(Continued)

OTHER PUBLICATIONS

Jun. 1, 2020 U.S. Notice of Allowance issued in U.S. Appl. No. 16/553,703.
(Continued)

*Primary Examiner* — William C. Dowling
(74) *Attorney, Agent, or Firm* — Oliff PLC

(57) ABSTRACT

A control device configured to communicate with a first projector which projects a first image in a first projection area, and a second projector which projects a second image in a second projection area having a first overlap area overlapping the first projection area to make the first projector and the second projector perform an edge blending process includes a reception section for receiving input of designation information including a direction in which an overlap width, a generation section for generating first overlap information including information representing first side in the first overlap area and information representing the overlap width of the first overlap area, and second overlap information including information representing second side in the first overlap area and the information, and a transmission section for transmitting the first overlap information to the first projector, and the second overlap information to the second projector.

7 Claims, 13 Drawing Sheets

(51) Int. Cl.
*G03B 21/13* (2006.01)
*H04N 21/41* (2011.01)
*G01R 11/24* (2006.01)
*G01R 21/06* (2006.01)
*G01R 33/00* (2006.01)
*G01R 33/02* (2006.01)
*G01R 33/12* (2006.01)

(52) U.S. Cl.
CPC ......... *G01R 33/0035* (2013.01); *G01R 33/02* (2013.01); *G01R 33/1253* (2013.01); *G03B 21/13* (2013.01); *G03B 21/142* (2013.01); *H04N 9/3182* (2013.01); *H04N 21/4122* (2013.01)

(58) Field of Classification Search
USPC .......................................................... 353/94
See application file for complete search history.

(56) References Cited

U.S. PATENT DOCUMENTS

| | | | | |
|---|---|---|---|---|
| 10,602,102 | B2 * | 3/2020 | Ishikawa | ................ G03B 21/14 |
| 2002/0024612 | A1 | 2/2002 | Gyoten | |
| 2002/0057361 | A1 * | 5/2002 | Mayer, III | ........... G03B 21/005 348/383 |
| 2013/0141475 | A1 | 6/2013 | Kotani | |
| 2014/0225909 | A1 | 8/2014 | Ouchi | |
| 2016/0162246 | A1 | 6/2016 | Ouchi | |
| 2017/0223320 | A1 | 8/2017 | Hiranuma | |
| 2017/0295349 | A1 | 10/2017 | Kasuga et al. | |
| 2019/0155563 | A1 | 5/2019 | Kotani | |
| 2019/0219903 | A1 | 7/2019 | Agustin | |
| 2019/0320148 | A1 | 10/2019 | Sugimoto | |
| 2020/0059632 | A1 * | 2/2020 | Naganuma | ............. G03B 21/14 |

FOREIGN PATENT DOCUMENTS

| | | |
|---|---|---|
| JP | 2015-169940 A | 9/2015 |
| JP | 2017-017509 A | 1/2017 |
| JP | 2017-138581 A | 8/2017 |
| JP | 2017-191307 A | 10/2017 |

OTHER PUBLICATIONS

"Operating Instructions Geometric & Setup Management Software", Geometry Manager Pro Ver. 4.0. pp. 91-104, 2017.
Oct. 6, 2020 Notice of Allowance issued in U.S. Appl. No. 16/553,703.
Nov. 17, 2020 Corrected Notice of Allowability issued in U.S. Appl. No. 16/553,703.

* cited by examiner

CONTROL DEVICE, MULTI-PROJECTION SYSTEM AND CONTROL METHOD OF CONTROL DEVICE

This is a continuation application of U.S. patent application Ser. No. 16/553,703, which is based on, and claims priority from JP Application Serial Number 2018-160070, filed Aug. 29, 2018, the disclosure of which is hereby incorporated by reference herein in its entirety.

BACKGROUND

1. Technical Field

The present disclosure relates to a control device, a multi-projection system and a control method of the control device.

2. Related Art

In recent years, there has been proposed a multi-projection system which combines respective images projected from a plurality of projectors with each other. When combining the respective images with each other, there is performed an edge blending process for overlapping the projection areas where the images are projected with each other and then adjusting the luminance of a part or the whole of the overlapping area are the projection areas overlap each other in order to make the junction of the images inconspicuous. In JP-A-2017-17509 (Document 1), there is disclosed a multi-projection system having a plurality of projectors each performing the edge blending process. The user inputs settings of the edge blending process to each of the projectors.

However, in the related art described above, since it becomes necessary to input the settings of the edge blending process to each of the projectors, there is a problem that it takes a lot of trouble with the input of the settings of the edge blending process.

SUMMARY

A control device according to a preferable aspect of the present disclosure is a control device configured to communicate with a first projector which projects a first image in a first projection area of a projection surface, and a second projector which projects a second image in a second projection area having a first overlap area overlapping the first projection area to make the first projector and the second projector perform an edge blending process of adjusting a luminance of an image projected in one of a part and a whole of the first overlap area, including a reception section configured to receive input of designation information including information representing a direction in which the first projection area overlaps the second projection area, and information representing a width of the first overlap area, a generation section configured to generate first overlap information including information representing a first side of the first projection area included in the first overlap area and information representing the width of the first overlap area, and second overlap information including information representing a second side of the second projection area included in the first overlap area and information representing the width of the first overlap area based on the designation information, and a transmission section configured to transmit the first overlap information to the first projector, and the second overlap information to the second projector.

A control device according to a preferable aspect of the present disclosure is a control device configured to communicate with a first projector which projects a first image in a first projection area of a projection surface, a second projector which projects a second image in a second projection area having a first overlap area overlapping the first projection area in a first direction, a third projector which projects a third image in a third projection area of the projection surface based on third image data, and a fourth projector which projects a fourth image in a fourth projection area having a second overlap area overlapping the third projection area in the first direction based on fourth image data to make the first projector and the second projector perform an edge blending process of adjusting a luminance of an image projected in a part of the first overlap area, and make the third projector and the fourth projector perform an edge blending process of adjusting a luminance of an image projected in a part of the second overlap area, the edge blending process being a process of adjusting a luminance of an image projected in a first area from a start line which is a line parallel to a second side of the second projection area and determines a starting position to a first side of the first projection area in the first overlap area, and a second area from the start line to a fourth side of the fourth projection area in the second overlap area, the control device including a reception section configured to receive designation information including a first distance from the start line to the first side, a second distance from the second side to the start line, information representing a direction in which the first projection area overlaps the second projection area, and information representing a direction in which the third projection area overlaps the fourth projection area, a generation section configured to generate first overlap information including information representing the first side of the first projection area and information representing the first distance, second overlap information including information representing the second side of the second projection area and information representing the first distance and the second distance, third overlap information including information representing the third side of the third projection area and the information representing the first distance and the second distance, and fourth overlap information including information representing the fourth side of the fourth projection area and the information representing the first distance based on the designation information, and a transmission section configured to transmit the first overlap information to the first projector, the second overlap information to the second projector, the third overlap information to the third projector, and the fourth overlap information to the fourth projector.

A multi-projection system according to a preferable aspect of the present disclosure is a multi-projection system including a first projector configured to project a first image in a first projection area of a projection surface based on first image data, a second projector configured to project a second image in a second projection area having a first overlap area overlapping the first projection area based on second image data, an image providing device configured to provide the first image data to the first projector, and the second image data to the second projector, and a control device configured to make the first projector and the second projector perform an edge blending process of adjusting a luminance of an image projected in one of a part and a whole of the first overlap area, wherein the control device includes a reception section configured to receive input of designation information including information representing a direction in which the first projection area overlaps the second projection area, and information representing a width of the first overlap area, a generation section configured to generate first overlap information including information representing a first side of the first projection area included in the first overlap area and the information representing the width of the first overlap area, and second overlap information including information representing a second side of the second projection area included in the first overlap area and the information representing the width of the first overlap area based on the designation information, and a transmission section configured to transmit the first overlap information to the first projector, and the second overlap information to the second projector, the first projector includes a first execution section configured to perform the edge blending process in one of a part and a whole of the first overlap area of the first image based on the first image data and the first overlap information, and a first projection section configured to project an image obtained by performing the edge blending process, and the second projector includes a second execution section configured to perform the edge blending process in one of a part and a whole of the first overlap area of the second image based on the second image data and the second overlap information, and a second projection section configured to project an image obtained by performing the edge blending process.

A multi-projection system according to a preferable aspect of the present disclosure is a multi-projection system including a first projector configured to project a first image in a first projection area of a projection surface based on first image data, a second projector configured to project a second image in a second projection area having a first overlap area overlapping the first projection area based on second image data, and a control device configured to make the first projector and the second projector perform an edge blending process of adjusting a luminance of an image projected in one of a part and a whole of the first overlap area, wherein the control device includes a storage section configured to store the first image data and the second image data, a reception section configured to receive input of designation information including information representing a direction in which the first projection area overlaps the second projection area, and information representing a width of the first overlap area, a generation section configured to generate first overlap information including information representing a first side of the first projection area included in the first overlap area and the information representing the width of the first overlap area, and second overlap information including information representing a second side of the second projection area included in the first overlap area and the information representing the width of the first overlap area based on the designation information, an execution section configured to perform the edge blending process in one of a part and a whole of the first overlap area of the first image based on the first image data and the first overlap information, and perform the edge blending process in one of a part and a whole of the first overlap area of the second image based on the second image data and the second overlap information, and a transmission section configured to transmit first edge blending image data representing an image obtained by performing the edge blending process in one of a part and a whole of the first overlap area of the first image to the first projector, and transmit second edge blending image data representing an image obtained by performing the edge blending process in one of a part and a whole of the first overlap area of the second image to the second projector, the first projector includes a first projection section configured to project the image represented by the first edge blending image data, and the second projector includes a second projection section configured to project the image represented by the second edge blending image data.

A control method of a control device according to a preferable aspect of the present disclosure is a control method of a control device configured to communicate with a first projector which projects a first image in a first projection area of a projection surface, and a second projector which projects a second image in a second projection area having a first overlap area overlapping the first projection area to make the first projector and the second projector perform an edge blending process of adjusting a luminance of an image projected in one of a part and a whole of the first overlap area, the method including the steps of receiving, by the control device, input of designation information including information representing a direction in which the first projection area overlaps the second projection area, and information representing a width of the first overlap area, generating, by the control device, first overlap information including information representing a first side of the first projection area included in the first overlap area and the information representing the width of the first overlap area, and second overlap information including information representing a second side of the second projection area included in the first overlap area and the information representing the width of the first overlap area based on the designation information, and transmitting, by the control device, the first overlap information to the first projector, and the second overlap information to the second projector.

DESCRIPTION OF EXEMPLARY EMBODIMENTS

Some embodiments of the present disclosure will hereinafter be described with reference to the accompanying drawings. It should be noted that in each of the drawings, the size and the scale of each of the constituents are arbitrarily made different from actual ones. Further, although the embodiments described below are preferable specific examples of the present disclosure, and are therefore provided with a variety of technically preferable limitations, the scope of the present disclosure is not limited to these embodiments unless the description to limit the present disclosure is particularly presented in the following description.

A. Embodiments

A control device 2 according to the present embodiment will hereinafter be described.

A.1. General Description of Control Device 2

Figure 1:
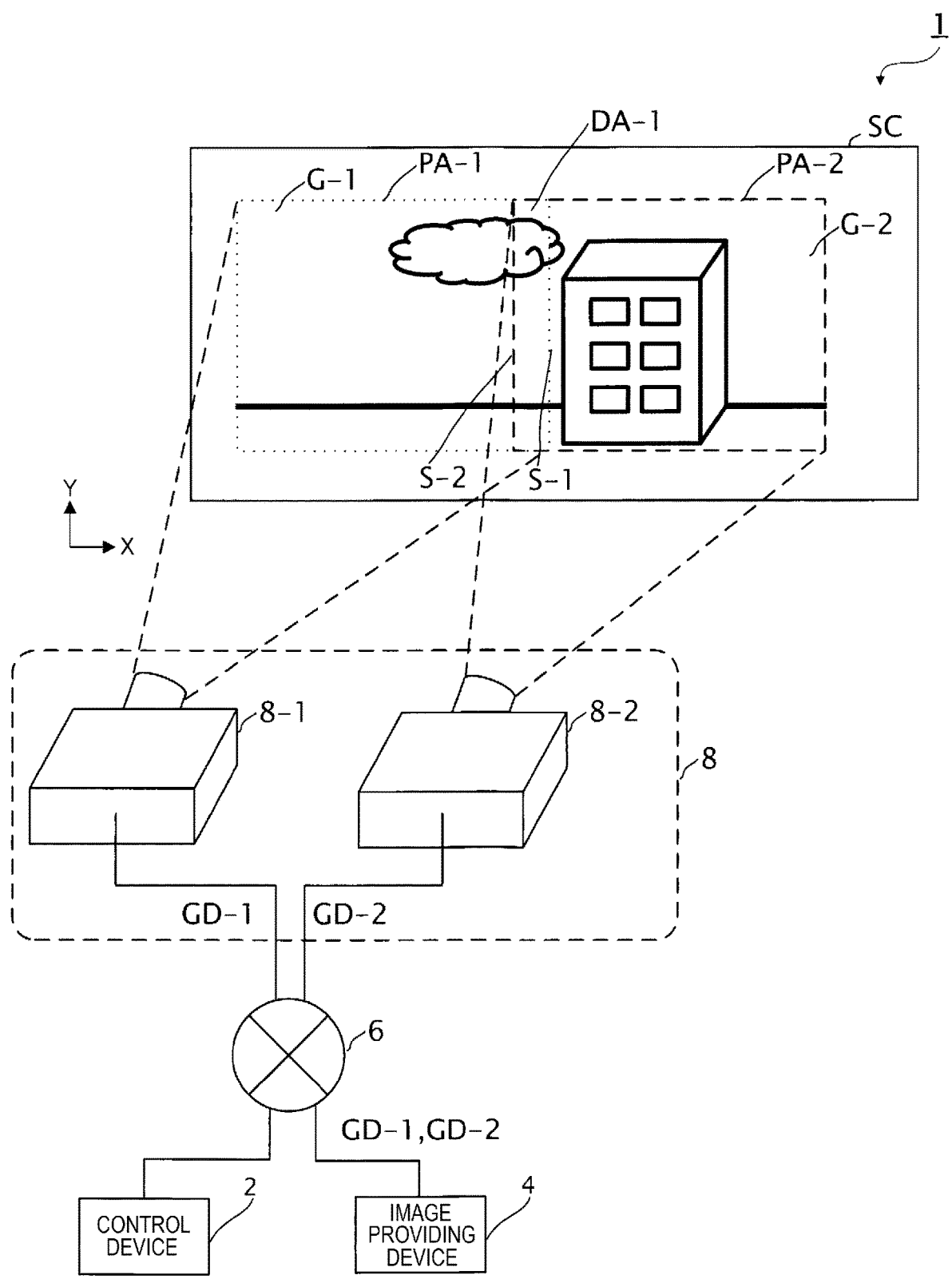
FIG. 1 is a diagram showing a multi-projection system 1 according to a first embodiment.

FIG. 1 shows a multi-projection system 1. The multi-projection system 1 includes a first projector 8-1 and a second projector 8-2, the control device 2 and an image providing device 4. The number of projectors 8 constituting the multi-projection system 1 is not limited to two, but can also be larger than two.

In the following description, when discriminating elements of the same type from each other, there are used the reference symbols such as the first projector 8-1 and the second projector 8-2. In contrast, when not discriminating the elements of the same type from each other, there is used the common number alone such as the projector 8 out of the reference symbols.

In the multi-projection system 1, the first projector 8-1 projects a first image G-1 in a first projection area PA-1 of a projection surface SC, and the second projector 8-2 projects a second image G-2 in a second projection area PA-2 of the projection surface SC.

In the following description, there are defined an X axis and a Y axis on the projection surface SC. The X axis and the Y axis are perpendicular to each other. Since the projection surface SC is normally perpendicular to the ground, a positive direction of the X axis and a negative direction of the X axis are hereinafter collectively referred to as a "horizontal direction" in some cases. Similarly, a positive direction of the Y axis and a negative direction of the Y axis are collectively referred to as a "vertical direction" in some cases. The positive direction of the X axis or the negative direction of the X axis is an example of a "first direction." The positive direction of the Y axis or the negative direction of the Y axis is an example of a "second direction."

As shown in FIG. 1, the first projection area PA-1 and the second projection area PA-2 overlap each other. An area where the first projection area PA-1 and the second projection area PA-2 overlap each other is referred to as a first overlap area DA-1.

The multi-projection system 1 performs an edge blending process of adjusting the luminance of an image projected in a part or the whole of the overlap area DA. By performing the edge blending process, the junction between the images G becomes inconspicuous. The description will hereinafter be presented assuming that the edge blending process is for adjusting the luminance of the whole of the overlap area DA for the sake of simplification of the explanation.

The control device 2 controls the projectors 8. The image providing device 4 provides the projectors 8 with image data GD representing the images G to be projected by the projectors 8. Specifically, the image providing device 4 provides the first image data GD-1 to the first projector 8-1, and the second image data GD-2 to the second projector 8-2. The projectors 8, the control device 2 and the image providing device 4 are coupled to each other via a network 6 such as a local area network (LAN).

A.2. Configuration of First Embodiment

Figure 2:
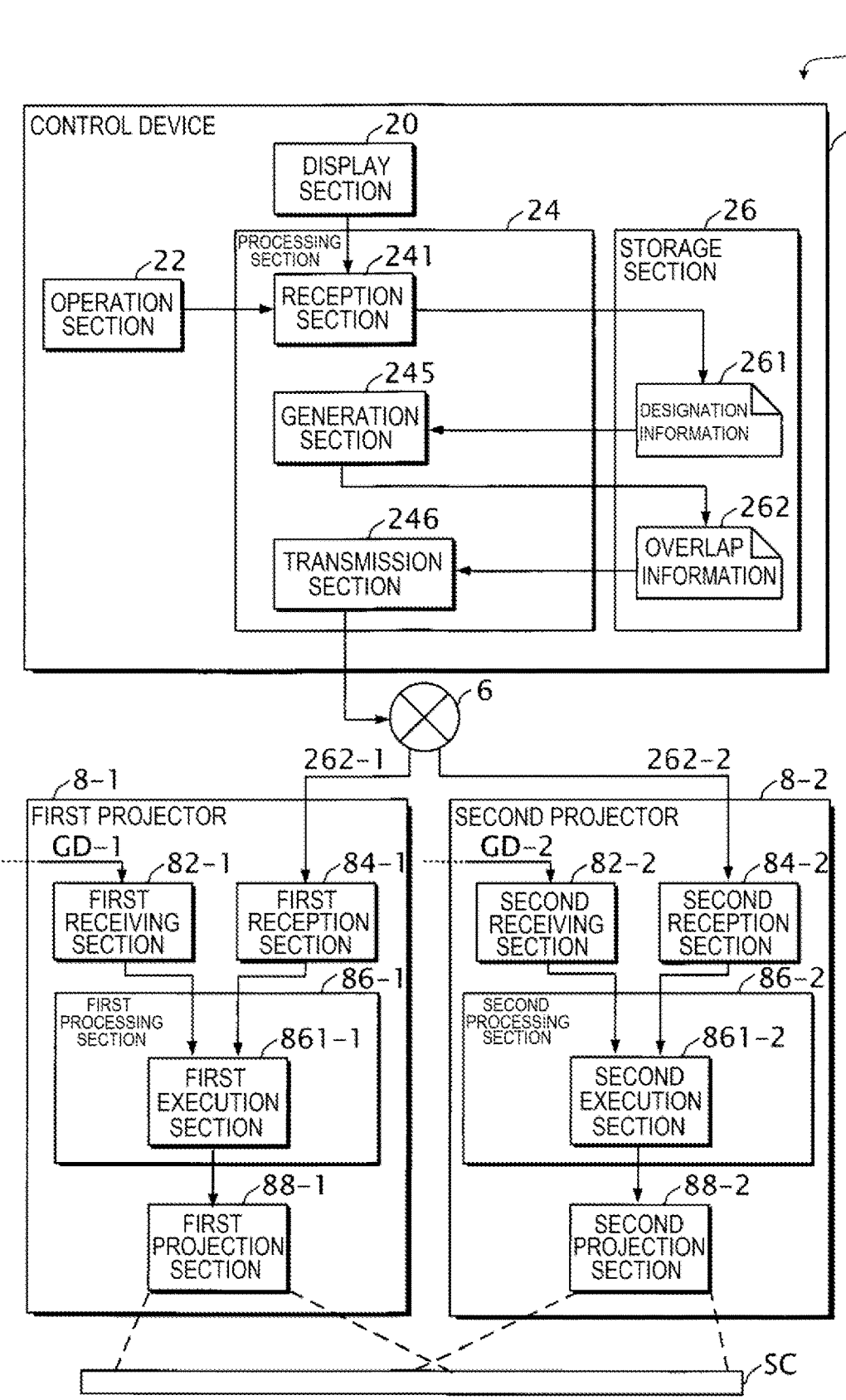
FIG. 2 is a diagram showing a configuration example of the multi-projection system 1 according to the first embodiment.

FIG. 2 shows a configuration example of the multi-projection system 1. The control device 2 has a display section 20, an operation section 22, a processing section 24 and a storage section 26.

The display section 20 is electrically coupled to the processing section 24, and is formed of a display panel such as a liquid crystal panel, an electronic paper panel or an organic electroluminescence panel.

The operation section 22 receives an operation by the user. The operation section 22 is, for example, a keyboard and a mouse.

The processing section 24 is a computer such as a central processing unit (CPU). The processing section 24 can also be formed of one processor, or a plurality of processors. The processing section 24 retrieves and then executes a program stored in the storage section 26 to thereby be provided with a reception section 241, a generation section 245 and a transmission section 246.

The reception section 241 receives input of designation information 261 including information representing a direction in which the first projection area PA-1 overlaps the second projection area PA-2, and information representing the width of the first overlap area DA-1. The width of the first overlap area DA-1 is specifically the width in a direction in which first projection area PA-1 overlaps the second projection area PA-2. The overlapping width is hereinafter referred to as an "overlap width." The designation information 261 is stored in the storage section 26.

In order to be used for input of the overlapping direction out of the designation information 261, the display section 20 displays a first simulant image SG-1 for simulating the first projection area PA-1 and a second simulant image SG-2 for simulating the second projection area PA-2.

Figure 3:
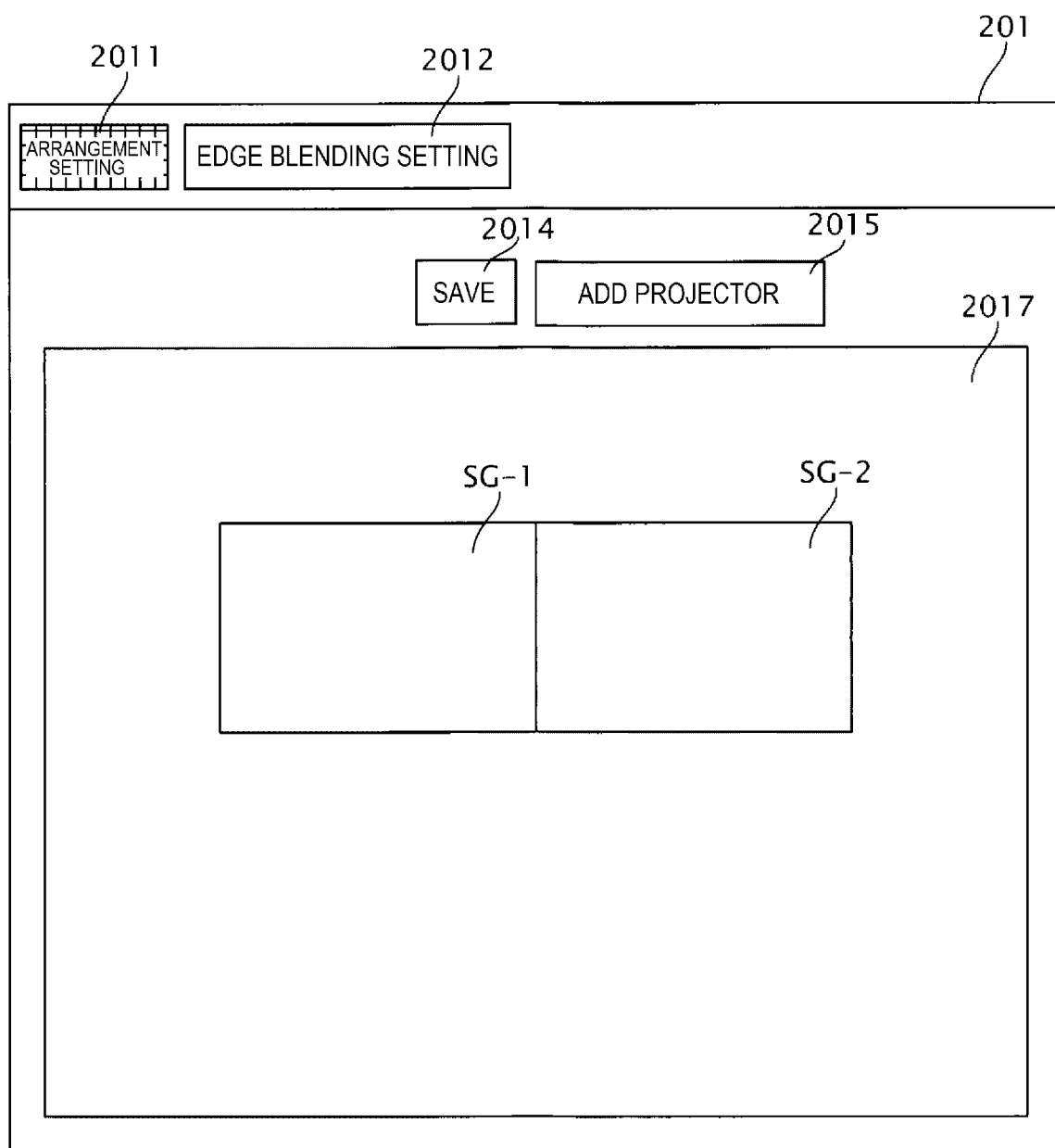
FIG. 3 is a diagram showing an example of an arrangement setting screen 201.

FIG. 3 shows an example of an arrangement setting screen 201 to be displayed on the display section 20. The arrangement setting screen 201 includes an ARRANGEMENT SETTING button 2011 and an EDGE BLENDING SETTING button 2012 arranged in an upper part of the arrangement setting screen 201, a SAVE button 2014 and an ADD PROJECTOR button 2015 arranged in a middle area of the arrangement setting screen 201, and a projection area arranging area 2017 arranged in a lower part of the arrangement setting screen 201. The projection area arranging area 2017 includes the first simulant image SG-1 and the second simulant image SG-2. The direction in which the projection areas PA overlap each other is determined in accordance with the positional relationship between the simulant images SG arranged in the projection area arranging area 2017. The ARRANGEMENT SETTING button 2011 shown in FIG. 3 is provided with grid-like hatching.

The reception section 241 receives input of a move operation of the first simulant image SG-1 and the second simulant image SG-2 to identify the direction in which the first simulant image SG-1 and the second simulant image SG-2 overlap each other based on the input of the move operation of the first simulant image SG-1 and the second simulant image SG-2. For example, the user performs a drag operation on the first simulant image SG-1 or the second simulant image SG-2. The reception section 241 identify the overlapping direction based on the positional relationship between the first simulant image SG-1 and the second simulant image SG-2.

The first projection area PA-1 and the second projection area PA-2 overlap each other in the horizontal direction or the vertical direction. In the example shown in FIG. 3, since the first simulant image SG-1 and the second simulant image SG-2 are arranged along a lateral direction, the first projection area PA-1 and the second projection area PA-2 overlap each other in the horizontal direction.

Regarding the overlap width, when the first projection area PA-1 and the second projection area PA-2 overlap each other in the horizontal direction, the designation information 261 includes the information representing the width in the horizontal direction of the first overlap area DA-1. In contrast, when the first projection area PA-1 and the second projection area PA-2 overlap each other in the vertical direction, the designation information 261 includes the information representing the width in the vertical direction of the first overlap area DA-1. An input example of the overlap width will be described using FIG. 4.

Figure 4:
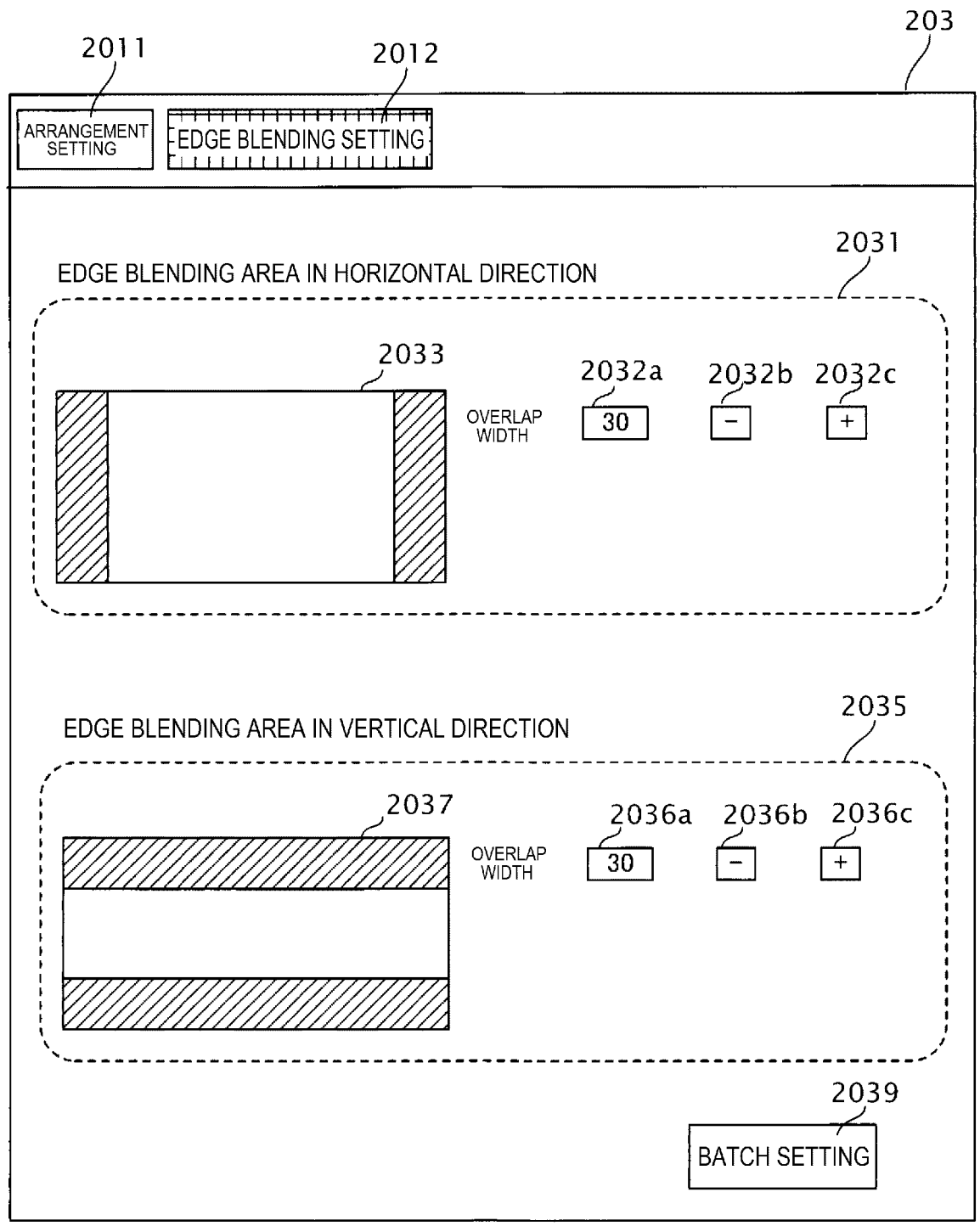
FIG. 4 is a diagram showing an example of an edge blending setting screen 203 in the first embodiment.

FIG. 4 shows an example of the edge blending setting screen 203. The edge blending setting screen 203 includes the ARRANGEMENT SETTING button 2011 and the EDGE BLENDING SETTING button 2012 arranged in the upper part of the edge blending setting screen 203, an input area 2031 of the edge blending process in the horizontal direction and an input area 2035 of the edge blending process in the vertical direction arranged in the middle part of the edge blending setting screen 203, and a BATCH SETTING button 2039. The EDGE BLENDING SETTING button 2012 shown in FIG. 4 is provided with grid-like hatching. This means that the name of the button provided with the grid-like hatching is the name of the present screen.

The input area 2031 has an entry field 2032a for inputting the overlap width when the first projection area PA-1 and the second projection area PA-2 overlap each other in the horizontal direction, a decrement button 2032b, an increment button 2032c and a preview image 2033. Due to a holding-down operation of the keyboard by the user, a numerical value representing the overlap width is input to the entry field 2032a. Due to a holding-down operation of the decrement button 2032b by the user with the mouse, the numerical value in the entry field 2032b is decremented. Due to a holding-down operation of the increment button 2032c by the user with the mouse, the numerical value in the entry field 2032b is incremented. The preview image 2033 shows an area of the edge blending process when performing the edge blending process using the numerical value in the entry field 2032a as the overlap width.

The input area 2035 has an entry field 2036a for inputting the overlap width when the first projection area PA-1 and the second projection area PA-2 overlap each other in the vertical direction, a decrement button 2036b, an increment button 2036c and a preview image 2037. Due to a holding-down operation of the keyboard by the user, a numerical value representing the overlap width is input to the entry field 2036a. Due to a holding-down operation of the decrement button 2036b by the user with the mouse, the numerical value in the entry field 2036b is decremented. Due to a holding-down operation of the increment button 2036c by the user with the mouse, the numerical value in the entry field 2036b is incremented. The preview image 2037 shows an area of the edge blending process when performing the edge blending process using the numerical value in the entry field 2036a as the overlap width.

The description will be returned to FIG. 2. The reception section 241 receives the input of the designation information 261. Specifically, the reception section 241 receives the input of the move operation of the first simulant image SG-1 and the second simulant image SG-2 and the input of the overlap width, and identifies the overlapping direction based on the input of the move operation of the first simulant image SG-1 and the second simulant image SG-2 to generate the designation information 261 including the overlapping direction thus identified and the overlapping width.

The generation section 245 generates first overlap information 262-1 and second overlap information 262-2 based on the designation information 261. In FIG. 2, in order to avoid complication of the drawing, the overlap information 262 is described as a representative of the first overlap information 262-1 and the second overlap information 262-2. The first overlap information 262-1 includes information representing a first side S-1 of the first projection area PA-1 included in the first overlap area DA-1 and information representing the width of the first overlap area DA-1. The information representing the width of the first overlap area DA-1 is the information representing the overlap width in the overlapping direction in the first overlap area DA-1. The second overlap information 262-2 includes information representing a second side S-2 of the second projection area PA-2 included in the first overlap area DA-1 and information representing the overlap width of the first overlap area DA-1. The generation section 245 generates the same number of pieces of overlap information 262 as the number of the projectors 8.

The information representing the side S is, for example, an identifier for identifying the side S or a character string representing the side S. For example, the character string representing the side S corresponds "upper side," "left side," "right side" or "lower side." The information representing the overlap width is, for example, the number of pixels of the overlap width, a value representing the overlap width in the metric system, or a value representing a proportion of the overlap width to the width in the overlapping direction in the projection area PA in percentage. As aspects of the overlap information 262, there can be cited, for example, the two alternatives described below. The first aspect of the overlap information 262 includes only the information representing the side S and the information representing the overlap width. The second aspect of the overlap information 262 corresponds to the information representing all of the sides of the overlap area DA, and the information representing the overlap width of each of the sides.

Using the example shown in FIG. 3 and FIG. 4, since the first side S-1 is set to the right side, and the overlap width is set to 30, the second aspect of the first overlap information 262-1 becomes, for example, "upper side 0, left side 0, right side 30, lower side 0." Similarly, since the first side S-2 is set to the left side, and the overlap width is set to 30, the second aspect of the second overlap information 262-2 becomes, for example, "upper side 0, left side 30, right side 0, lower side 0."

The transmission section 246 transmits the first overlap information 262-1 to the first projector 8-1, and the second overlap information 262-2 to the second projector 8-2.

The storage section 26 is a recording medium which can be read by the processing section 24. The storage section 26 is formed of one or more species of storage circuits such as a read only memory (ROM), an erasable programmable ROM (RPROM), an electrically erasable programmable ROM (EEPROM) and a random access memory (RAM). The storage section 26 stores the designation information 261 and the overlap information 262.

The first projector 8-1 has a first receiving section 82-1, a first reception section 84-1, a first processing section 86-1 and a first projection section 88-1. The second projector 8-2 has a second receiving section 82-2, a second reception section 84-2, a second processing section 86-2 and a second projection section 88-2. Hereinafter, the description will be presented using the first projector 8-1 as an example.

The first receiving section 82-1 receives the first image data GD-1 from the image providing device 4.

The first reception section 84-1 receives the first overlap information 262-1 from the control device 2.

The first processing section 86-1 is a computer such as a CPU. The first processing section 86-1 can also be formed of one processor, or a plurality of processors. The first processing section 86-1 retrieves and then executes a program stored in a storage section of the first projector 8-1 to thereby be provided with a first execution section 861-1.

The first execution section 861-1 performs the edge blending process in the first overlap area DA-1 of the first image G-1 based on the first image data GD-1 and the first overlap information 262-1.

The first projection section 88-1 projects an image obtained by performing the edge blending process in the first overlap area DA-1 of the first image G-1.

Figure 5:
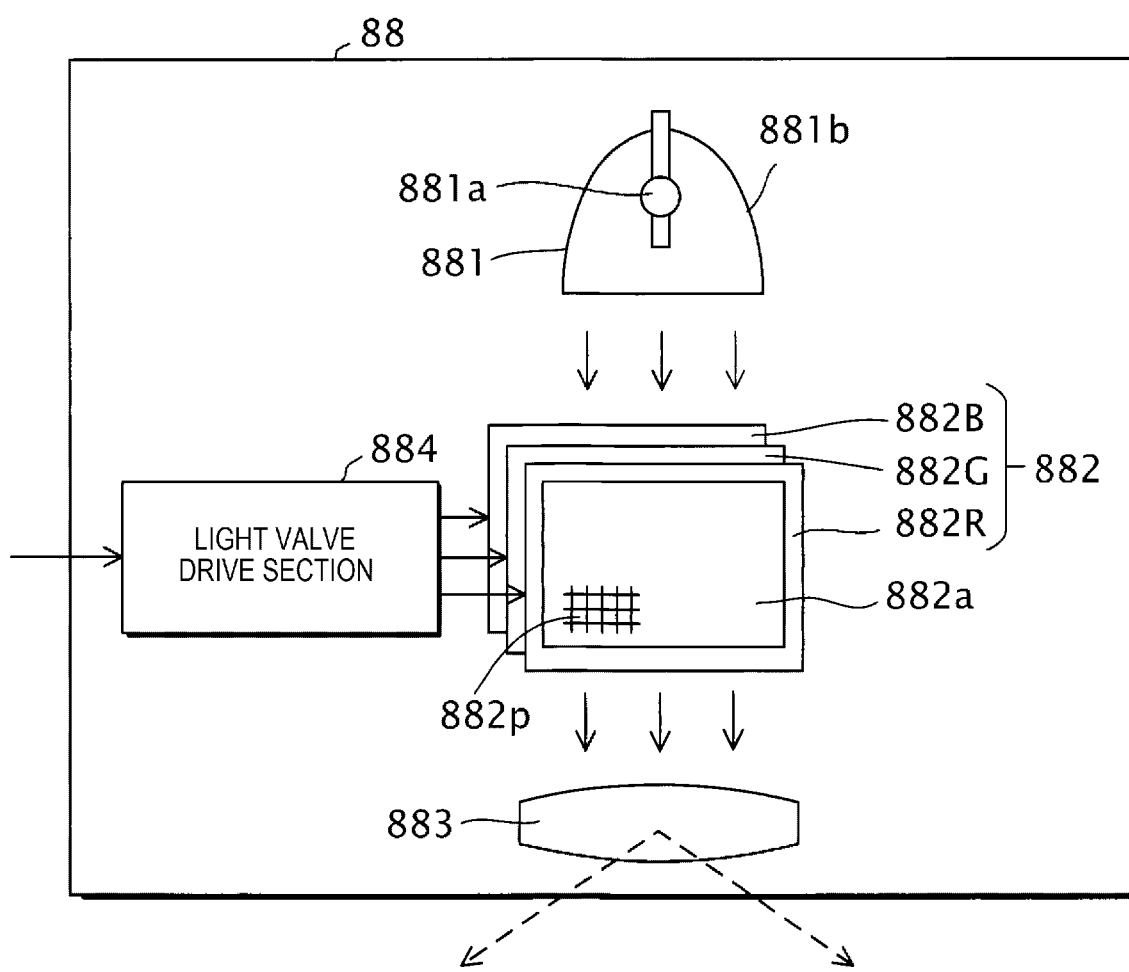
FIG. 5 is a diagram showing an example of a projection section 88.

FIG. 5 shows an example of the projection section 88. The projection section 88 includes a light source 881, three liquid crystal light valves 882R, 882G and 882B as an example of a light modulation device, a projection lens 883 as an example of a projection optical system, a light valve drive section 884 and so on. The projection section 88 modulates the light emitted from the light source 881 with the liquid crystal light valves 882 to form an image, and then projects the image from the projection lens 883 in an enlarged manner. The image is displayed on the projection surface SC.

The light source 881 includes a light source section 881a formed of a xenon lamp, a super high-pressure mercury lamp, an LED, a laser source or the like, and a reflector 881b for reducing a variation in direction of the light radiated by the light source section 881a. The light emitted from the light source 881 is reduced in variation in the luminance distribution by an integrator optical system not shown, and is then separated by a color separation optical system not shown into colored light components of red, green and blue as three primary colors of light. The colored light components of red, green and blue respectively enter the liquid crystal light valves 882R, 882G and 882B.

The liquid crystal light valves 882 are each formed of a liquid crystal panel having a liquid crystal material encapsulated between a pair of transparent substrates, and so on. The liquid crystal light valves 882 are each provided with a pixel area 882a having a rectangular shape and formed of a plurality of pixels 882p arranged in a matrix. In each of the liquid crystal light valves 882, it is possible to apply a drive voltage to the liquid crystal for each of the pixels 882p. When the light valve drive section 884 applies the drive voltages corresponding to the image data representing the image to be projected on the projection surface SC to the respective pixels 882p, each of the pixels 882p is set to a light transmittance corresponding to image information. Therefore, the light emitted from the light source 881 is transmitted through the pixel area 882a to thereby be modulated, and thus, the image corresponding to the image data to be projected on the projection surface SC is formed for each colored light.

The description will be returned to FIG. 2. The configuration of the second projector 8-2 is substantially the same as the configuration of the first projector 8-1. The second receiving section 82-2 receives the second image data GD-2 from the image providing device 4. The second reception section 84-2 receives the second overlap information 262-2 from the control device 2.

The second processing section 86-2 is a computer such as a CPU. The second processing section 86-2 can also be formed of one processor, or a plurality of processors. The second processing section 86-2 retrieves and then executes a program stored in a storage section of the second projector 8-2 to thereby be provided with a second execution section 861-2.

The second execution section 861-2 performs the edge blending process in the first overlap area DA-1 of the second image G-2 based on the second image data GD-2 and the second overlap information 262-2. The second projection section 88-2 projects an image obtained by performing the edge blending process in the first overlap area DA-1 of the second image G-2.

A.3. Operation of Multi-Projection System 1 in Present Embodiment

Then, the flowchart showing the content of the operation of the multi-projection system 1 will be described using FIG. 6 and FIG. 7.

Figure 6:
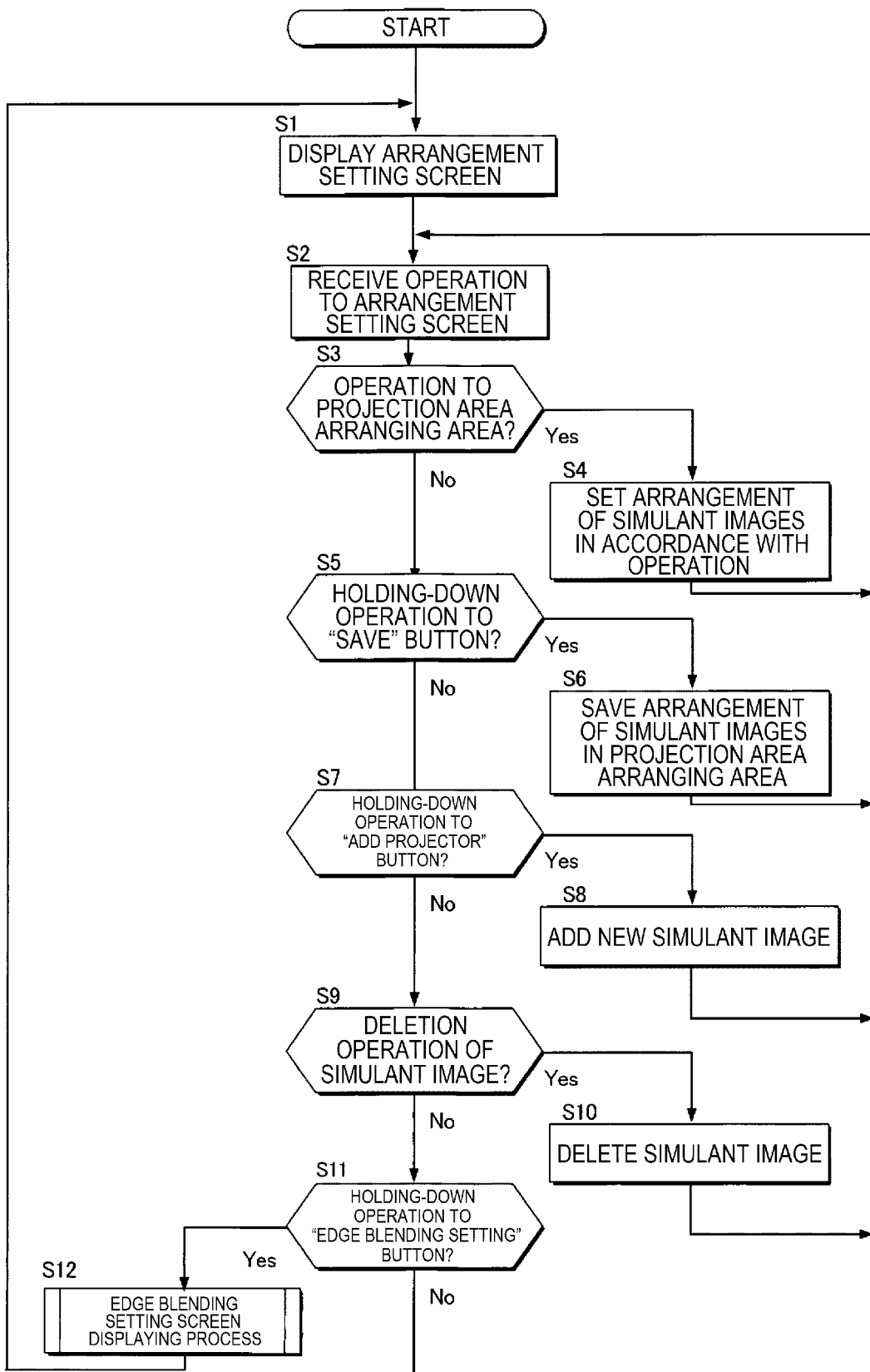
FIG. 6 is a diagram showing a flowchart showing a content of an operation of the multi-projection system 1.

FIG. 6 is a flowchart showing the content of the operation of the multi-projection system 1. The display section 20 displays the arrangement setting screen 201 in the step S1. The processing section 24 receives the operation to the arrangement setting screen 201 in the step S2. The processing section 24 determines whether or not the operation having been received is an operation to the projection area arranging area 2017 in the step S3. The operation to the projection area arranging area 2017 is, for example, a drag operation of the mouse to the inside of the projection area arranging area 2017.

In the case of Yes in the step S3, namely when the operation having been received is the operation to the projection area arranging area 2017, the processing section 24 sets the arrangement of the simulant image SG in accordance with the operation having been received in the step S4. For example, the processing section 24 moves the position of the simulant image SG to be disposed at the starting position of the drag operation to the ending position of the drag operation, and makes the display section 20 display the simulant image SG having been moved. After the completion of the process in the step S4, the processing section 24 returns the process to the step S2.

In contrast, in the case of No in the step S3, namely when the operation having been received is not the operation to the projection area arranging area 2017, the processing section 24 determines whether or not the operation having been received is a holding-down operation to the SAVE button 2014 in the step S5. In the case of Yes in the step S5, namely when the operation having been received is the holding-down operation to the SAVE button 2014, the processing section 24 saves the arrangement of all of the simulant images SG in the projection area arranging area 2017 in the step S6. After the completion of the process in the step S6, the processing section 24 returns the process to the step S2.

In contrast, in the case of No in the step S5, namely when the operation having been received is not the holding-down operation to the SAVE button 2014, the processing section 24 determines whether or not the operation having been received is a holding-down operation to the ADD PROJECTOR button 2015 in the step S7. In the case of Yes in the step S7, namely when the operation having been received is the holding-down operation to the ADD PROJECTOR button 2015, the processing section 24 adds a new simulant image SG in the projection area arranging area 2017 in the step S8. After the completion of the process in the step S8, the processing section 24 returns the process to the step S2.

In contrast, in the case of No in the step S7, namely when the operation having been received is not the holding-down operation to the ADD PROJECTOR button 2015, the processing section 24 determines whether or not the operation having been received is a deletion operation of the simulant image SG in the step S9. In the case of Yes in the step S9, namely when the operation having been received is the deletion operation of the simulant image SG, the processing section 24 deletes the simulant image SG in the step S10. After the completion of the process in the step S10, the processing section 24 returns the process to the step S2.

In contrast, in the case of No in the step S9, namely when the operation having been received is not the deletion operation of the simulant image SG, the processing section 24 determines whether or not the operation having been received is a holding-down operation to the EDGE BLENDING SETTING button 2012 in the step S11. When the operation having been received is not the holding-down operation to the EDGE BLENDING SETTING button 2012 (No in the step S11), the processing section 24 returns the process to the step S2.

In the case of Yes in the step S11, namely when the operation having been received is the holding-down operation to the EDGE BLENDING SETTING button 2012, the processing section 24 performs the edge blending setting screen displaying process in the step S12.

Figure 7:
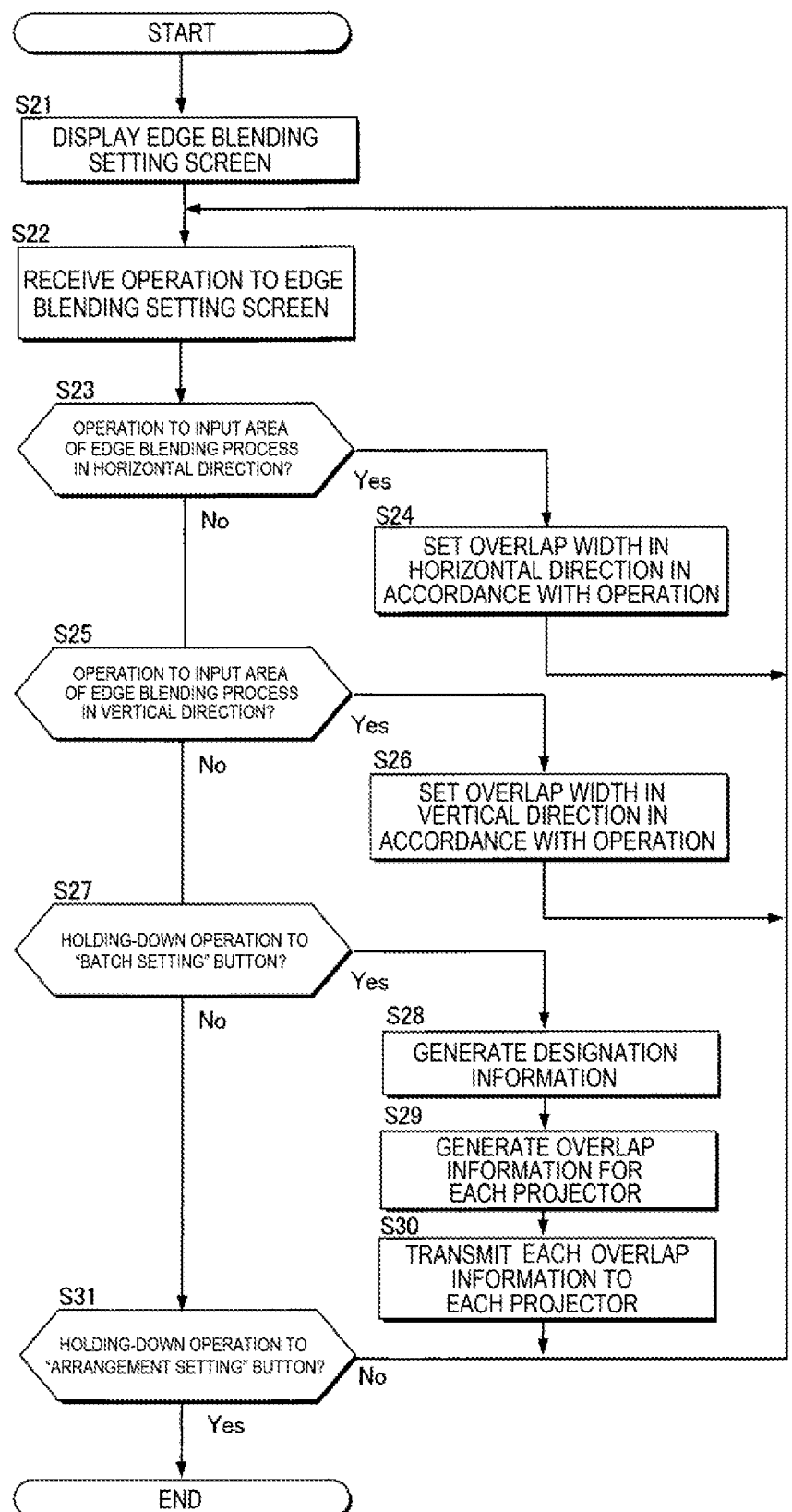
FIG. 7 is a diagram showing a flowchart representing a content of an edge blending setting screen displaying process.

FIG. 7 is a flowchart showing a content of the edge blending setting screen displaying process. The display section 20 displays the edge blending setting screen 203 in the step S21. Then, the processing section 24 receives an operation to the edge blending setting screen 203 in the step S22. The processing section 24 determines whether or not the operation having been received is an operation to the input area 2031 for the edge blending process in the horizontal direction in the step S23. The operation to the input area 2031 includes, for example, an input operation of a numerical value to the entry field 2032*a*, a holding-down operation of the decrement button 2032*b*, and the holding-down operation of the increment button 2032*c*.

In the case of Yes in the step S23, namely when the operation having been received is the operation to the input area 2031 for the edge blending process in the horizontal direction, the processing section 24 sets the overlap width in the horizontal direction in accordance with the operation having been received in the step S24. After the completion of the process in the step S24, the processing section 24 returns the process to the step S22.

In contrast, in the case of No in the step S23, namely when the operation having been received is not the operation to the input area 2031 for the edge blending process in the horizontal direction, the processing section 24 determines whether or not the operation having been received is an operation to the input area 2035 for the edge blending process in the vertical direction in the step S25. In the case of Yes in the step S25, namely when the operation having been received is the operation to the input area 2035 for the edge blending process in the vertical direction, the processing section 24 sets the overlap width in the vertical direction in accordance with the operation in the step S26. After the completion of the process in the step S26, the processing section 24 returns the process to the step S22.

In contrast, in the case of No in the step S25, namely when the operation having been received is not the operation to the input area 2035 for the edge blending process in the vertical direction, the processing section 24 determines whether or not the operation having been received is a holding-down operation to the BATCH SETTING button 2039 in the step S27. In the case of Yes in the step S27, namely when the operation having been received is the holding-down operation to the BATCH SETTING button 2039, the reception section 241 generates the designation information 261 based on the arrangement of the simulant images SG in the projection area arranging area 2017, the numerical value in the entry field 2032*a* and the numerical value in the entry field 2036*a* as the operation input by the user in the step S28. Then, the generation section 245 generates the overlap information 262 for each of the projectors 8 based on the designation information 261 in the step S29. Then, the transmission section 246 transmits the overlap information 262 to the respective projectors 8 in the step S30. After the completion of the process in the step S30, the processing section 24 returns the process to the step S22.

In contrast, in the case of No in the step S27, namely when the operation having been received is not the holding-down operation to the BATCH SETTING button 2039, the processing section 24 determines whether or not the operation having been received is a holding-down operation to the ARRANGEMENT SETTING button 2011 in the step S31. In the case of No in the step S31, namely when the operation having been received is not the holding-down operation to the ARRANGEMENT SETTING button 2011, the processing section 24 returns the process to the step S22. In contrast, in the case of No in the step S31, namely when the operation having been received is the holding-down operation to the ARRANGEMENT SETTING button 2011, the processing section 24 terminates the series of processes shown in FIG. 7. Then, the processing section 24 returns the process to the step S1. Therefore, the display section 20 displays the arrangement setting screen 201 once again.

A.4. Advantages of First Embodiment

As described hereinabove, in an aspect of the control device 2, the control device 2 communicates with the first projector 8-1 for projecting the first image G-1 in the first projection area PA-1 of the projection surface SC based on the first image data GD-1, and the second projector 8-2 for projecting the second image G-2 in the second projection area PA-2 having the first overlap area DA-1 overlapping the first projection area PA-1 based on the second image data GD-2 to thereby make the first projector 8-1 and the second projector 8-2 perform the edge blending process for adjusting the luminance of the image projected in a part or the whole of the first overlap area DA-1. Further, the control device 2 has the reception section 241, the generation section 245 and the transmission section 246. The reception section 241 receives input of the designation information 261 including the information representing the direction in which the first projection area PA-1 overlaps the second projection area PA-2, and the information representing the width of the first overlap area. Based on the designation information 261, the generation section 245 generates the first overlap information 262-1 including the information representing the first side S-1 of the first projection area PA-1 included in the first overlap area DA-1 and the information representing the width of the first overlap area DA-1, and the second overlap information 262-2 including the information representing the second side S-2 of the second projection area PA-2 included in the first overlap area DA-1 and the information representing the width of the first overlap area DA-1. The transmission section 246 transmits the first overlap information 262-1 to the first projector 8-1, and the second overlap information 262-2 to the second projector 8-2.

Normally, it is required for the user to input the side of the first overlap area DA-1 out of the first projection area PA-1 and the overlap width of this side, and the side of the first overlap area DA-1 out of the second projection area PA-2 and the overlap width of this side.

In contrast, according to the aspect described hereinabove, when the user inputs just the direction in which the first projection area PA-1 overlaps the second projection area PA-2, and the overlap width in this direction, the control device 2 sets the edge blending process of the first projection area PA-1 and the second projection area PA-2 in a lump. Therefore, since the user is not required to input the overlap width of the overlap information 262 and the side requiring the edge blending process for each of the first projector 8-1 and the second projector 8-2, the trouble with the input of the setting of the edge blending process is reduced, and it becomes possible to shorten the time necessary for the input of the setting of the edge blending process. Further, in an aspect of the control device 2, the first projection area PA-1 and the second projection area PA-2 overlap each other in the horizontal direction or the vertical direction. When the first projection area PA-1 and the second projection area PA-2 overlap each other in the horizontal direction, the designation information 261 includes the information representing the overlap width in the horizontal direction of the first overlap area DA-1, and when the first projection area PA-1 and the second projection area PA-2 overlap each other in the vertical direction, the designation information 261 includes the information representing the overlap width in the vertical direction of the first overlap area DA-1.

According to the aspect described hereinabove, it is possible for the control device 2 to respectively set the overlap width when the first projection area PA-1 and the second projection area PA-2 overlap each other in the horizontal direction, and the overlap width when the areas overlap each other in the vertical direction. Generally, since the width in the horizontal direction and the width in the vertical direction of the projection area PA are different from each other, it is preferable for the overlap widths in the respective directions to be able to be set to respective values different from each other.

Further, in an aspect of the control device 2, the control device 2 is provided with the display section 20 for displaying the first simulant image SG-1 simulating the first projection area PA-1 and the second simulant image SG-2 simulating the second projection area PA-2, and the reception section 241 receives the input of the move operation of the first simulant image SG-1 and the second simulant image SG-2 and the input of the overlap width, and receives the process of identifying the overlapping direction based on the input of the move operation of the first simulant image SG-1 and the second simulant image SG-2 to generate the designation information 261 including the information representing the overlapping direction thus identified and the overlap width as the input of the designation information 261.

According to the aspect described hereinabove, it becomes possible for the user to visually set the direction in which the first projection area PA-1 and the second projection area PA-2 overlap each other.

Further, in an aspect of the multi-projection system 1, the multi-projection system 1 includes the first projector 8-1 for projecting the first image G-1 in the first projection area PA-1 of the projection surface SC based on the first image data GD-1, the second projector 8-2 for projecting the second image G-2 in the second projection area PA-2 having the first overlap area DA-1 overlapping the first projection area PA-1 based on the second image data GD-2, the image providing device 4 for providing the first image data GD-1 to the first projector 8-1 and the second image data GD-2 to the second projector 8-2, and the control device 2 for making the first projector 8-1 and the second projector 8-2 perform the edge blending process for adjusting the luminance of the image projected in a part or the whole of the first overlap area DA-1.

The control device 2 is provided with the reception section 241, the generation section 245 and the transmission section 246, wherein the reception section 241 receives the input of the designation information 261 including the information representing the direction in which the first projection area PA-1 overlaps the second projection area PA-2 and the information representing the width of the first overlap area DA-1, the generation section 245 generates the first overlap information 262-1 including the information representing the first side S-1 of the first projection area PA-1 included in the first overlap area DA-1 and the information representing the width of the first overlap area DA-1, and the second overlap information 262-2 including the information representing the second side S-2 of the second projection area PA-2 included in the first overlap area DA-1 and the information representing the width of the first overlap area DA-1 based on the designation information 261, and the transmission section 246 transmits the first overlap information 262-1 to the first projector 8-1, and the second overlap information 262-2 to the second projector 8-2.

The first projector 8-1 is provided with the first execution section 861-1 and the first projection section 88-1, wherein the first execution section 861-1 performs the edge blending process in a part or the whole of the first overlap area DA-1 of the first image G-1 based on the first image data GD-1 and the first overlap information 262-1, and the first projection section 88-1 projects the image obtained by performing the edge blending process.

The second projector 8-2 is provided with the second execution section 861-2 and the second projection section 88-2, wherein the second execution section 861-2 performs the edge blending process in a part or the whole of the second overlap area DA-1 of the second image G-2 based on the second image data GD-1 and the second overlap information 262-2, and the second projection section 88-2 projects the image obtained by performing the edge blending process.

According to the aspect described hereinabove, since the user is not required to input the overlap width of the overlap information 262 and the side requiring the edge blending process for each of the first projector 8-1 and the second projector 8-2, the trouble with the input of the setting of the edge blending process is reduced, and it becomes possible to shorten the time necessary for the input of the setting of the edge blending process.

B. Second Embodiment

In the first embodiment, there are provided the two projectors 8. In contrast, in a second embodiment, there are further added two projectors 8. The second embodiment will hereinafter be described. It should be noted that in each of the embodiments and each of the modified examples illustrated hereinafter, regarding the elements substantially the same in operation and function as those in the first embodiment, the symbols used in the first embodiment are diverted, and the detailed description of each of such elements are arbitrarily omitted.

B.1. General Description of Second Embodiment

Figure 8:
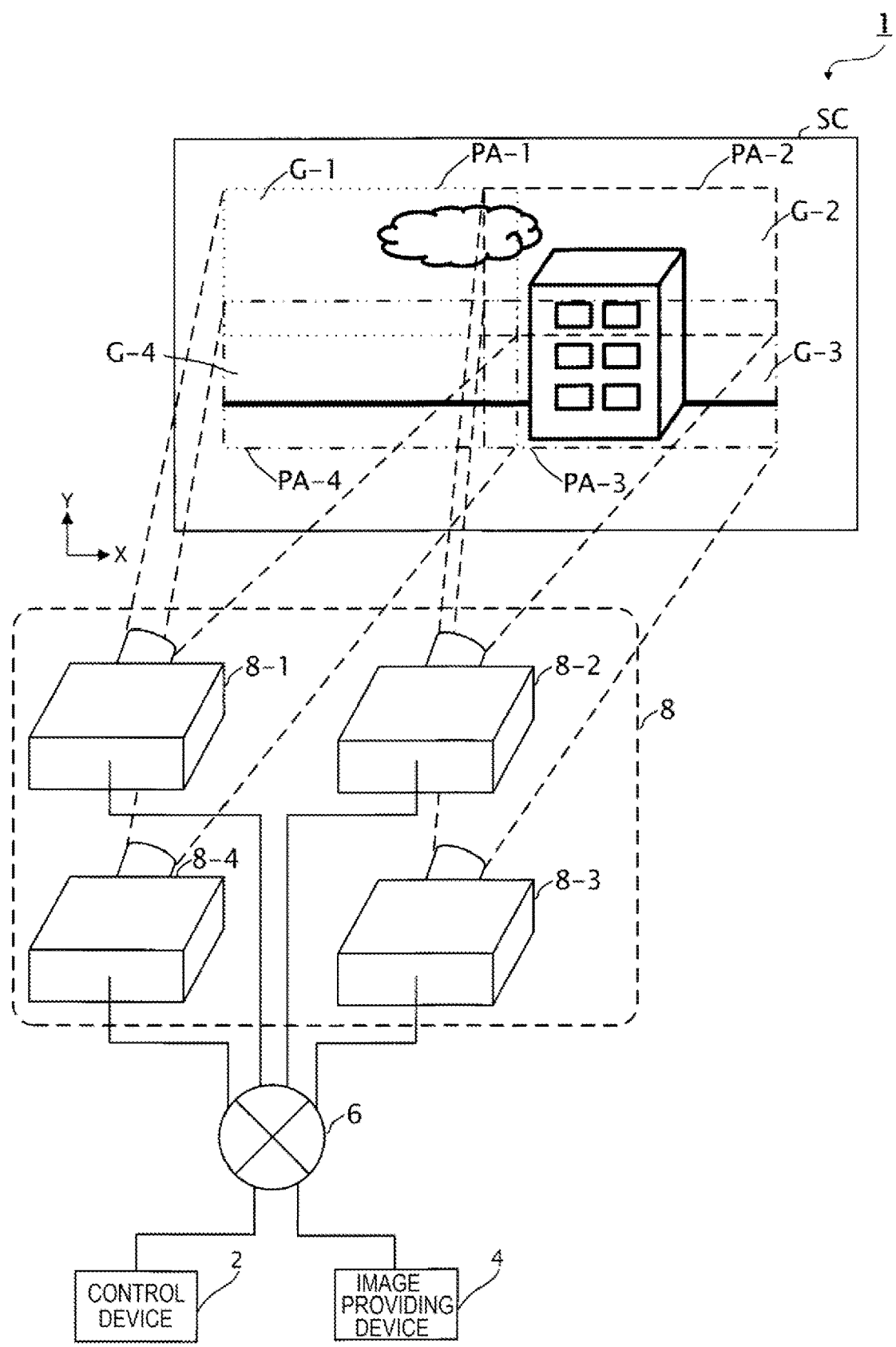
FIG. 8 is a diagram showing a multi-projection system 1 according to a second embodiment.

FIG. 8 shows a multi-projection system 1 according to the second embodiment. To the second embodiment, there are added a third projector 8-3 and a fourth projector 8-4 in addition to the first projector 8-1 and the second projector 8-2. The elements described hereinafter are assumed to be the elements related to the second embodiment unless particularly described for the sake of abbreviation of the explanation. The third projector 8-3 projects a third image G-3 in a third projection area PA-3 of the projection surface SC, and a fourth projector 8-4 projects a fourth image G-4 in a fourth projection area PA-4 of the projection surface SC.

Figure 9:
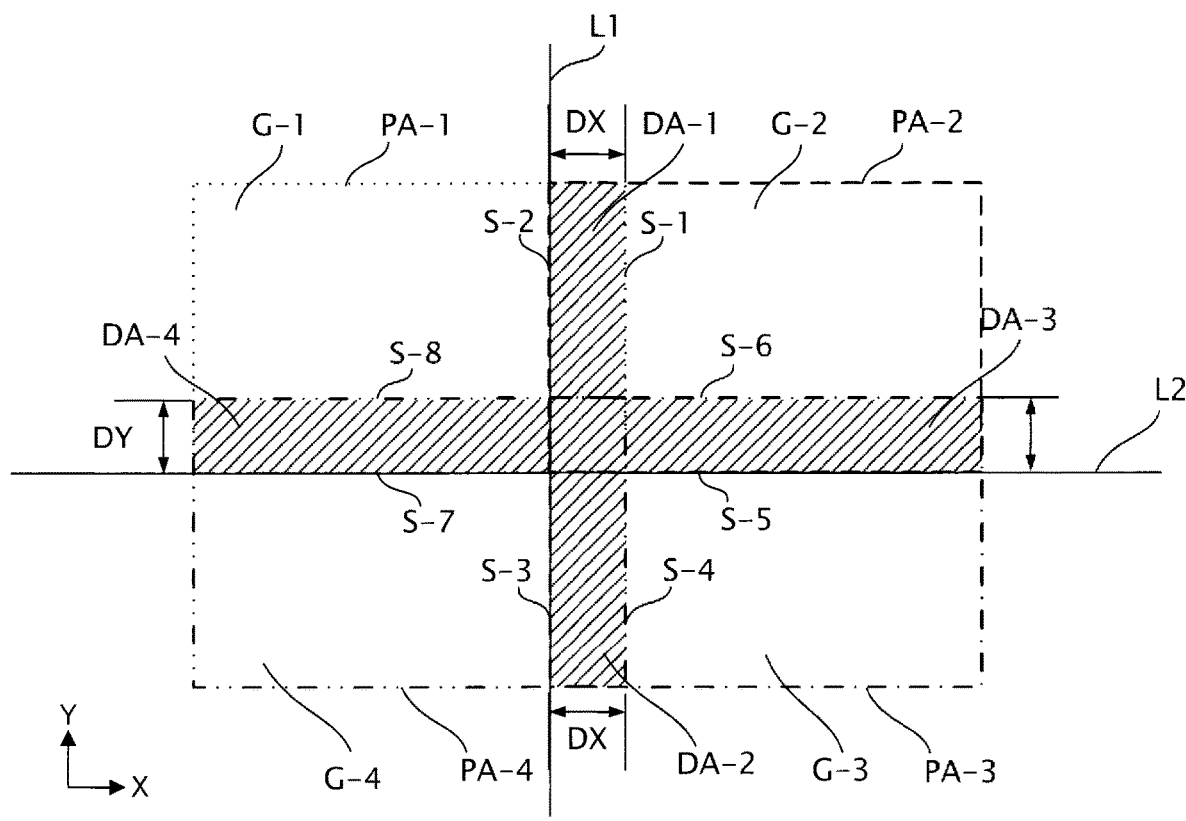
FIG. 9 is a diagram showing a positional relationship between projection areas PA in the second embodiment.

FIG. 9 shows a positional relationship between the projection areas PA. In the second embodiment, the case of performing the blending process only in the horizontal direction and the case of performing the blending process in both of the horizontal direction and the vertical direction will be described. The area provided with the hatching with lines extending from the upper right toward the lower left in FIG. 9 corresponds to the overlap area DA.

B.1.1. Case of Performing Blending Process Only in Horizontal Direction

The third projection area PA-3 and the fourth projection area PA-4 include a second overlap area DA-2 where the third projection area PA-3 and the fourth projection area PA-4 overlap each other in the horizontal direction. Further, the closer the width in the horizontal direction of the second overlap area DA-2 is to the first width DX, the more preferable, wherein the first width DX is the same as the width in the horizontal direction of the first overlap area DA-1. Further, the closer to the straight line L1 the second side S-2 of the second projection area PA-2 and the third side S-3 of the third projection area PA-3 included in the second overlap area DA-2 are located, the more preferable. The closer the width in the horizontal direction of the second overlap area DA-2 is to the first width DX which is the same as the width in the horizontal direction of the first overlap area DA-1, and the closer to the straight line L1 the second side S-2 and the third side S-3 are located, the more accurately the positions of the images on which the edge blending process is performed are uniformed in the horizontal direction. Therefore, it is possible to prevent an uncomfortable feeling from being provided to the user.

In FIG. 9, in order to avoid complicating the illustration, the width in the horizontal direction of the second overlap area DA-2 is the first width DX which is the same as the width in the horizontal direction of the first overlap area DA-1, and the second side S-2 and the third side S-3 are located on the straight line L1.

The generation section 245 generates the first overlap information 262-1 and the second overlap information 262-2 in the first embodiment, and at the same time, generates third overlap information 262-3 and fourth overlap information 262-4. The third overlap information 262-3 includes the third side S-3 and the first side DX as the information representing the width in the horizontal direction of the first overlap area DA-1. The fourth overlap information 262-4 includes the fourth side S-4 of the fourth projection area PA-4 included in the second overlap area DA-2, and the first side DX.

The transmission section 246 transmits the third overlap information 262-3 to the third projector 8-3, and the fourth overlap information 262-4 to the fourth projector 8-4.

The third projector 8-3 projects an image obtained by performing the edge blending process in the second overlap area DA-2 of the third image G-3. The fourth projector 8-4 projects an image obtained by performing the edge blending process in the second overlap area DA-2 of the fourth image G-4.

As described hereinabove, in an aspect of the control device 2, the control device 2 communicates with the third projector 8-3 for projecting the third image G-3 in the third projection area PA-3 of the projection surface SC based on the third image data GD-3, and the fourth projector 8-4 for projecting the fourth image G-4 in the fourth projection area PA-4 having the second overlap area DA-2 overlapping the third projection area PA-3 in the horizontal direction based on the fourth image data GD-4 to thereby make the third projector 8-3 and the fourth projector 8-4 perform the edge blending process for adjusting the luminance of the image projected in a part or the whole of the second overlap area DA-2. Further, the first projection area PA-1 and the second projection area PA-2 overlap each other in the horizontal direction. The designation information 261 includes information representing a direction in which the third projection area PA-3 overlaps the fourth projection area PA-4. Based on the designation information 261, the generation section 245 generates the third overlap information 262-3 including information representing the third side S-3 included in the second overlap area DA-2 and the information representing the first width DX, and the fourth overlap information 262-4 including the information representing the fourth side S-4 of the fourth projection area PA-4 included in the second overlap area DA-2 and the information representing the first width DX. The transmission section 246 transmits the first overlap information 262-1 to the first projector 8-1, the second overlap information 262-2 to the second projector 8-2, and at the same time, transmits the third overlap information 262-3 to the third projector 8-3, and the fourth overlap information 262-4 to the fourth projector 8-4.

When arranging the four projection areas PA as shown in FIG. 9, it is common that a value close to the width of the area in which the first projector 8-1 and the second projector 8-2 perform the edge blending process is applied to the width of the area in which the third projector 8-3 and the fourth projector 8-4 perform the edge blending process. According to the aspect described hereinabove, when the user inputs just the direction in which the projection areas PA overlap each other, and the overlap width in this direction, it is possible for the control device 2 to set the edge blending process in the horizontal direction of the first projection area PA-1, the second projection area PA-2, the third projection area PA-3 and the fourth projection area PA-4 in a lump. Therefore, since the user is not required to input the overlap width of the three overlap areas PA and the sides requiring the edge blending process, the trouble with the input of the setting of the edge blending process is reduced, and it becomes possible to shorten the time necessary for the input of the setting of the edge blending process.

B.1.2. Case of Performing Blending Process in Horizontal Direction and Vertical Direction The second projection area PA-2 and the third projection area PA-3 overlap each other in the vertical direction. Similarly, the first projection area PA-1 and the fourth projection area PA-4 overlap each other in the vertical direction. In other words, the projection surface SC has the two projection areas PA arranged in the horizontal direction, and the two projection areas PA arranged in the vertical direction. Further, the second projection area PA-2 and the third projection area PA-3 have a third overlap area DA-3 where the second projection area PA-2 and the third projection area PA-3 overlap each other. Similarly, the first projection area PA-1 and the fourth projection area PA-4 share a fourth overlap area DA-4. Further, the closer to a straight line L2 a fifth side S-5 of the second projection area PA-2 and a seventh side S-7 of the first projection area PA-1 are located, the more preferable, wherein the fifth side S-5 is included in the third overlap area DA-3, and the seventh side S-7 is included in the fourth overlap area DA-4. Further, the closer the width in the vertical direction of the third overlap area DA-3 is to a second width DY, the more preferable, wherein the second width DY is the same as the width in the vertical direction of the fourth overlap area DA-4. The closer the width in the vertical direction of the third overlap area DA-3 is to the second width DY which is the same as the width in the vertical direction of the fourth overlap area DA-4, and the closer to the straight line L2 the fifth side S-5 and the seventh side S-7 are located, the more accurately the positions of the images on which the edge blending process is performed are uniformed in the vertical direction. Therefore, it is possible to prevent an uncomfortable feeling from being provided to the user.

In FIG. 9, in order to avoid complicating the illustration, the width in the vertical direction of the third overlap area DA-3 is the second width DY which is the same as the width in the vertical direction of the fourth overlap area DA-4, and the fifth side S-5 and the seventh side S-7 are located on the straight line L2.

The designation information 261 includes the direction in which the first projection area PA-1 and the second projection area PA-2 overlap each other, the direction in which the third projection area PA-3 and the fourth projection area PA-4 overlap each other, the direction in which the second projection area PA-2 and the third projection area PA-3 overlap each other, the direction in which the first projection area PA-1 and the fourth projection area PA-4 overlap each other, and the first width DX and the second width DY as overlap widths.

The generation section 245 generates the first overlap information 262-1, the second overlap information 262-2, the third overlap information 262-3 and the fourth overlap information 262-4 based on the designation information 261.

The first overlap information 262-1 includes the information representing the first side S-1, the information representing the seventh side S-7, and the information representing the second width DY as the information representing the width in the vertical direction of the fourth overlap area DA-4.

The second overlap information 262-2 includes the information representing the second side S-2, the information representing the first width DX, the information representing the fifth side S-5, and the information representing the second width DY.

The third overlap information 262-3 includes the information representing the third side S-3, the information representing the first width DX, the information representing a sixth side S-6 of the third projection area PA-3 included in the third overlap area DA-3, and the information representing the second width DY.

The fourth overlap information 262-4 includes the information representing the fourth side S-4, the information representing the first width DX, the information representing an eighth side S-8 of the fourth projection area PA-4 included in the fourth overlap area DA-4, and the information representing the second width DY.

For example, the first overlap information 262-1 is "upper side 0, left side DX, right side 0, lower side DY."

The first projector 8-1 projects an image obtained by performing the edge blending process in the first overlap area DA-1 and the fourth overlap area DA-4 of the first image G-1. The second projector 8-2 projects an image obtained by performing the edge blending process in the first overlap area DA-1 and the third overlap area DA-3 of the second image G-2. The third projector 8-3 projects an image obtained by performing the edge blending process in the second overlap area DA-2 and the third overlap area DA-3 of the third image G-3. The fourth projector 8-4 projects an image obtained by performing the edge blending process in the second overlap area DA-2 and the fourth overlap area DA-4 of the fourth image G-4.

B.2. Advantages of Second Embodiment

As described hereinabove, in an aspect of the control device 2, the second projection area PA-2 and the third projection area PA-3 overlap each other in the vertical direction, and the designation information 261 includes the information representing the direction in which the second projection area PA-2 overlaps the third projection area PA-3, the information representing the direction in which the first projection area PA-1 overlaps the fourth projection area PA-4, and the information representing the width in the vertical direction of the third overlap area DA-3 in which the second projection area PA-2 and the third projection area PA-3 overlap each other.

The first overlap information 262-1 includes the information representing the seventh side S-7 of the first projection area PA-1 included in the fourth overlap area DA-4 in which the first projection area PA-1 and the fourth projection area PA-4 overlap each other, and the information representing the width in the vertical direction of the third overlap area DA-3. The first projector 8-1 uses the width in the vertical direction of the third overlap area DA-3 as the width in the vertical direction of the fourth overlap area DA-4.

The second overlap information 262-2 includes the information representing the fifth side S-5 of the second projection area PA-2 included in the third overlap area DA-3, and the information representing the width in the vertical direction of the third overlap area DA-3.

The third overlap information 262-3 includes the information representing the sixth side S-6 of the third projection area PA-3 included in the third overlap area DA-3, and the information representing the width in the vertical direction of the third overlap area DA-3.

The fourth overlap information 262-4 includes the information representing the eighth side S-8 of the fourth projection area PA-4 included in the fourth overlap area DA-4, and the information representing the width in the vertical direction of the third overlap area DA-3. The fourth projector 8-4 uses the width in the vertical direction of the third overlap area DA-3 as the width in the vertical direction of the fourth overlap area DA-4.

When arranging the four projection areas PA as shown in FIG. 9, it is common that a value close to the width of the area in which the second projector 8-2 and the third projector 8-3 perform the edge blending process is applied to the width of the area in which the first projector 8-1 and the fourth projector 8-4 perform the edge blending process. According to the aspect described hereinabove, when the user inputs just the width with which the projection areas PA overlap each other in the horizontal direction, and the width with which the projection areas PA overlap each other in the vertical direction, it is possible for the control device 2 to set the edge blending process in the horizontal direction and the vertical direction of the first projection area PA-1, the second projection area PA-2, the third projection area PA-3 and the fourth projection area PA-4 in a lump. Therefore, since the user is not required to input the three overlap widths of the projection areas PA overlapping each other in the horizontal direction, the three overlap widths of the projection areas PA overlapping each other in the vertical direction, and the side requiring the edge blending process, the trouble with the input of the setting of the edge blending process is reduced, and it becomes possible to shorten the time necessary for the input of the setting of the edge blending process.

Figure 10:
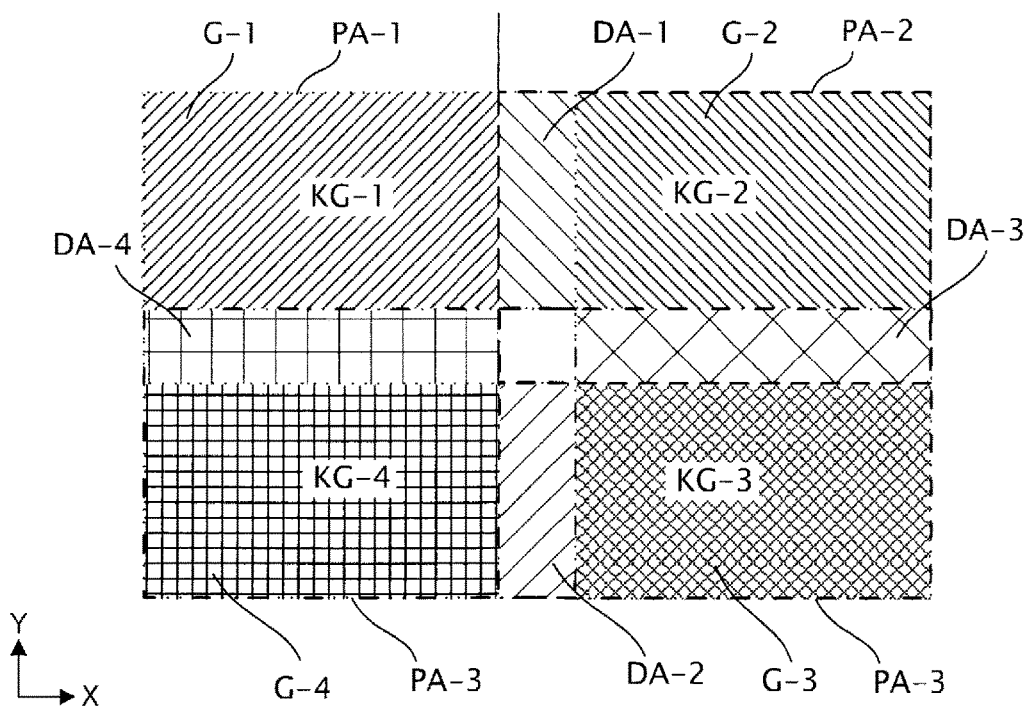
FIG. 10 is a diagram showing an example of confirmation images KG.

Further, when performing the edge blending process in the horizontal direction and the vertical direction, as an aspect to the control device 2, the control device 2 makes the projectors 8 project confirmation images KG shown in FIG. 10 to thereby make it possible to allow the user to confirm whether or not the first projection area PA-1, the second projection area PA-2, the third projection area PA-3 and the fourth projection area PA-4 are set correctly. The confirmation image KG is different by the projector 8.

FIG. 10 shows an example of the confirmation images KG. After the process in the step S30, namely after transmitting the first overlap information 262-1, the second overlap information 262-2, the third overlap information 262-3 and the fourth overlap information 262-4, the transmission section 246 transmits an instruction of projecting a first confirmation image KG-1 to the first projector 8-1, an instruction of projecting a green image as a second confirmation image KG-2 to the second projector 8-2, an instruction of projecting a magenta image as a third confirmation image KG-3 to the third projector 8-3, and an instruction of projecting a cyan image as a fourth confirmation image KG-4 to the fourth projector 8-4. It should be noted that the projectors 8 do not perform the edge blending process on the confirmation images KG.

The first confirmation image KG-1 is a red image. The second confirmation image KG-2 is the green image. The third confirmation image KG-3 is the magenta image. The fourth confirmation image KG-4 is the cyan image. In FIG. 10, red is represented by the hatching with the lines extending from the upper right toward the lower left, green is represented by the hatching with lines extending from the upper left toward the lower right, magenta is represented by the hatching like an oblique mesh, and cyan is represented by the hatching like a mesh. The color of an area not overlapping other overlap areas DA in the first overlap area DA-1 becomes yellow due to additive color mixing of red and green. The color of an area not overlapping other overlap areas DA in the second overlap area DA-2 becomes whitish blue due to additive color mixing of magenta and cyan. The color of an area not overlapping other overlap areas DA in the third overlap area DA-3 becomes whitish gray due to additive color mixing of green and magenta. The color of an area not overlapping other overlap areas DA in the fourth overlap area DA-4 becomes whitish gray due to additive color mixing of red and cyan. The color of an area where all of the first overlap area DA-1, the second overlap area DA-2, the third overlap area DA-3 and the fourth overlap area DA-4 overlap each other becomes white due to additive color mixing of red, green, magenta and cyan. In FIG. 10, the area where all of the first overlap area DA-1, the second overlap area DA-2, the third overlap area DA-3 and the fourth overlap area DA-4 overlap each other is described as an area not provided with hatching.

Here, red is one of the light's three primary colors, and is an example of a "first color." Green is one of the light's three primary colors, and is an example of a "second color." Blue is one of the light's three primary colors, and is an example of a "third color." Magenta is a color obtained by additive color mixing of red and blue, and is an example of a "fourth color." Cyan is a color obtained by additive color mixing of green and blue, and is an example of a "fifth color."

As described hereinabove, in one aspect of the control device 2, after transmitting the first overlap information 262-1, the second overlap information 262-2, the third overlap information 262-3 and the fourth overlap information 262-4, the instruction of projecting the image of the first color of the light's three primary colors is transmitted to the first projector 8-1, the instruction of projecting the image of the second color of the light's three primary colors is transmitted to the second projector 8-2, the instruction of projecting the image of the fourth color obtained by additive color mixing of the first color and the third color of the light's three primary colors is transmitted to the third projector 8-3, and the instruction of projecting the image of the fifth color obtained by additive color mixing of the second color and the third color is transmitted to the fourth projector 8-4.

According to the aspect described hereinabove, when the projection areas PA are set correctly, a color of the central part where the first overlap area DA-1, the second overlap area DA-2, the third overlap area DA-3 and the fourth overlap area DA-4 overlap each other becomes white due to additive color mixing of the first color, the second color, the fourth color and the fifth color. In contrast, when the projection areas PA are not set correctly, for example, when the projection areas PA fail to overlap each other, the white part does not exist. Therefore, it becomes possible for the user to visually determine whether or not the projection areas PA are set correctly with ease.

C. Modified Examples

Each of the embodiments described hereinabove can variously be modified. Specific modified aspects will hereinafter be illustrated. Tow or more aspects arbitrarily selected from the following illustrations can arbitrarily be combined unless conflicting with each other. It should be noted that in each of the modified examples illustrated hereinafter, regarding the elements substantially the same in operation and function as those in the embodiments, the reference symbols in the above description are diverted to arbitrarily omit the detailed description of each of such elements.

C.1. First Modified Example

The edge blending process of adjusting the luminance of an image projected in the whole of the overlap area DA is performed in the first embodiment, but this is not a limitation. In the first modified example, an edge blending process of adjusting the luminance of an image projected in apart of the overlap area DA is performed. The elements described hereinafter are assumed to be the elements related to the first modified example unless particularly described for the sake of abbreviation of the explanation. As the situations in which it is desired to adjust the luminance of a part of the overlap area DA, the two situations described below can be cited. The first situation corresponds to when an object which the user particularly desires to display shows up in the overlap area DA. The junction between the images G becomes inconspicuous due to the edge blending process, but the overlap fails to be achieved correctly to generate two images in some cases. Therefore, it is preferable to avoid setting the area where the object which the user particularly desires to display shows up to the area in which the edge blending process is to be performed. The second situation corresponds to when the overlap width of the overlap area DA exceeds an appropriate length. This is because the longer the overlap width of the overlap area DA is, the larger the processing amount of edge blending process becomes.

Similarly to the second embodiment, in the first modified example, the projection surface SC has the two projection areas PA arranged in the horizontal direction and the two projection areas PA arranged in the vertical direction, and the edge blending process of adjusting the luminance of images projected in a part of the first overlap area DA-1, a part of the second overlap area DA-2, a part of the third overlap area DA-3 and a part of the fourth overlap area DA-4 of the second embodiment is performed. It should be noted that in the first modified example, in order to make the explanation easier, it is assumed that the edge blending process of adjusting the luminance of images projected in the whole of the second overlap area DA-2, the whole of the third overlap area DA-3, the whole of the first overlap area DA-1 and the whole of the fourth overlap area DA-4 is not performed.

Hereinafter, a set of the first overlap area DA-1 and the second overlap area DA-2, and a set of the third overlap area DA-3 and the fourth overlap area DA-4 are collectively referred to as "overlap areas DA in the horizontal direction" in some cases. Further, a set of the second overlap area DA-2 and the third overlap area DA-3, and a set of the first overlap area DA-1 and the fourth overlap area DA-4 are collectively referred to as "overlap areas DA in the vertical direction" in some cases.

Figure 11:
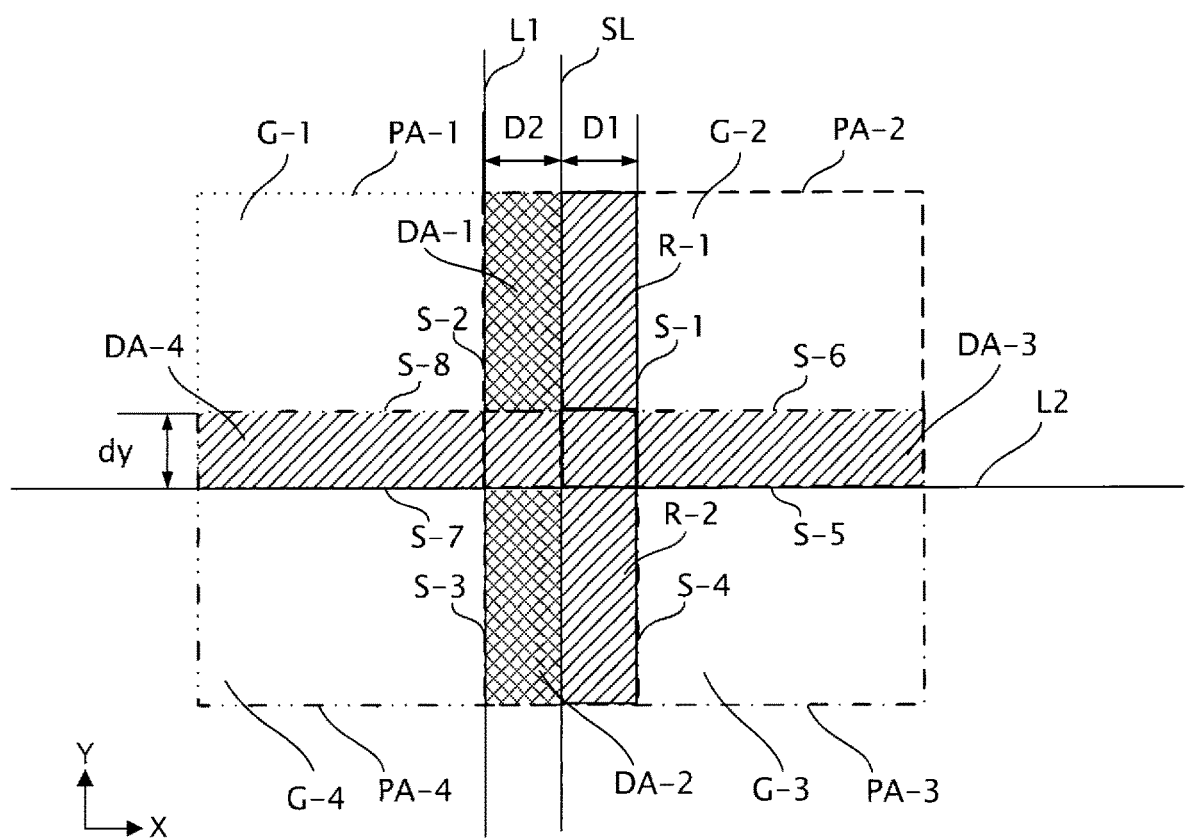
FIG. 11 is a diagram showing a positional relationship between projection areas PA in a first modified example.

FIG. 11 shows a positional relationship between the projection areas PA. The area provided with the hatching with lines extending from the upper right toward the lower left and the area provided with the hatching like an oblique mesh in FIG. 11 correspond to the overlap areas DA. The projectors 8 perform the edge blending process in a first area R-1 and a second area R-2 provided with the hatching with the lines extending from the upper right toward the lower left in the overlap areas DA.

The first area R-1 is an area from a start line SL which is a line parallel to the second side S-2, and determines a starting position to the first side S-1 in the first overlap area DA-1. The second area R-2 is an area from the start line SL to the fourth side S-4 in the second overlap area DA-2.

The reception section 241 receives the designation information 261 including a first distance D1 from the start line SL to the first side S-1, a second distance D2 from the second side S-2 to the start line SL, the direction in which the first projection area PA-2, and the direction in which the third projection area PA-3 overlaps the fourth projection area PA-4. The first direction D1 corresponds to the widths of the first area R-1 and the second area R-2 in which the edge blending process is performed. Hereinafter, in order to make the explanation easy, the first distance D1 is referred to as an "edge blending width." The second distance D2 coincides with the values of the starting positions of the first area R-1 and the second area R-2 when setting the second side S-2 as a reference.

Figure 12:
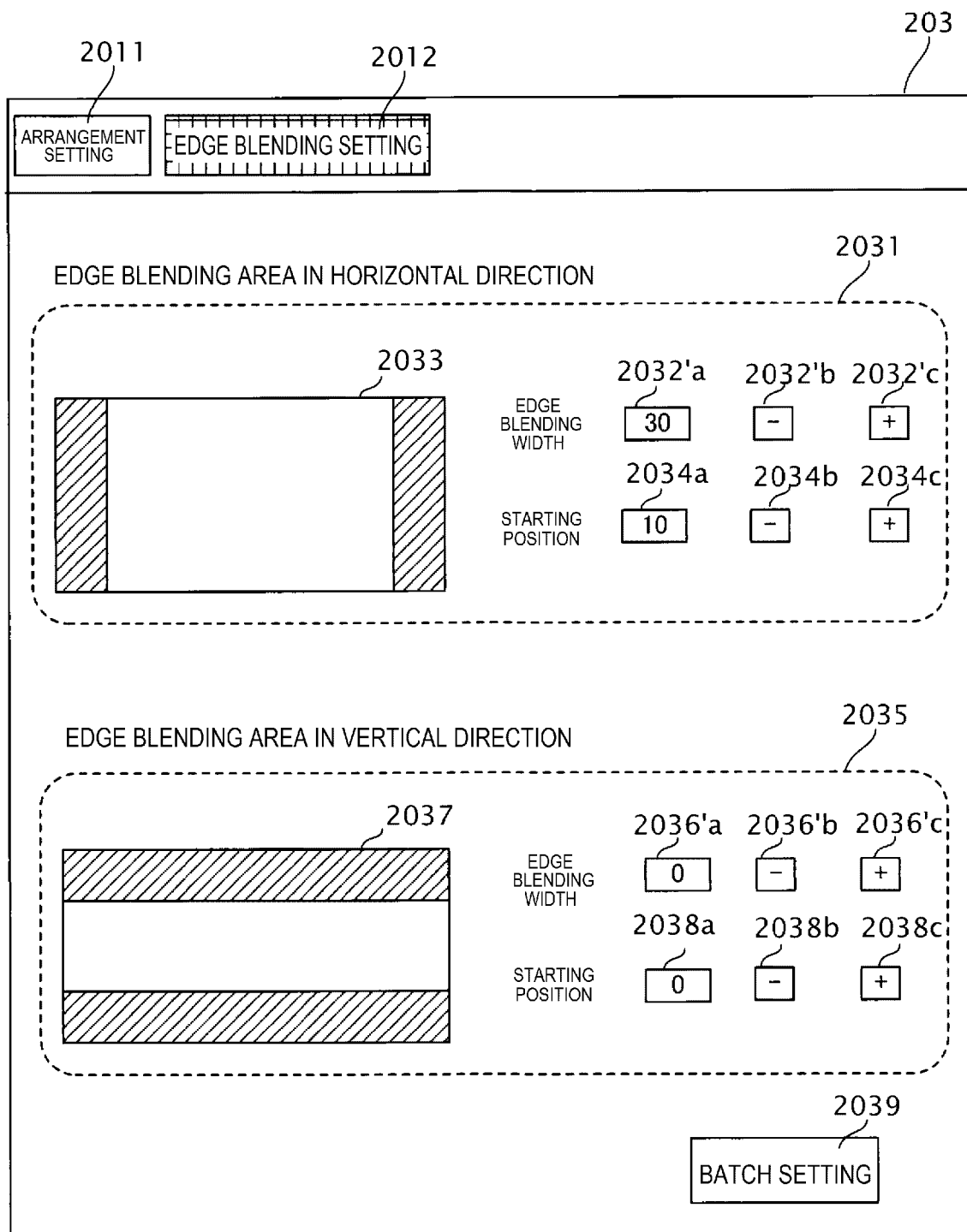
FIG. 12 is a diagram showing an example of an edge blending setting screen 203 in the first modified example.

FIG. 12 shows an example of the edge blending setting screen 203. The edge blending setting screen 203 has a user interface (UI) for making it possible to receive the first distance D1 and the second distance D2. Further, the edge blending setting screen 203 has a UI capable of dealing with when performing the edge blending process of adjusting the luminance of a part of the overlap area DA in the horizontal direction, and when performing the edge blending process of overlapping the luminance of a part of the overlap area DA in the vertical direction.

Specifically, the input area 2031 has an entry field 2032'*a*, a decrement button 2032'*b* and an increment button 2032'*c* for the edge blending width, and the preview image 2033. Further, the input area 2031 has an entry field 2034*a*, a decrement button 2034*b* and an increment button 2034*c* for the starting position when performing the edge blending process of adjusting the luminance of a part of the overlap area DA in the horizontal direction.

Further, the input area 2035 has an entry field 2036'*a*, a decrement button 2036'*b* and an increment button 2036'*c* for the edge blending width, and the preview image 2037. Further, the input area 2035 has an entry field 2038*a*, a decrement button 2038*b* and an increment button 2038*c* for the starting position when performing the edge blending process of adjusting the luminance of a part of the overlap area DA in the vertical direction.

The reception section 241 receives the value in the entry field 2032'*a* as the first distance D1, and the value in the entry field 2034*a* as the second distance D2 to generate the designation information 261.

The generation section 245 generates the first overlap information 262-1, the second overlap information 262-2, the third overlap information 262-3 and the fourth overlap information 262-4 based on the designation information 261. The first overlap information 262-1 includes the information representing the first side S-1 and information representing the first distance D1. The first overlap information 262-2 includes the information representing the second side S-2 and information representing the first distance D1 and the second distance D2. The third overlap information 262-3 includes the information representing the third side S-3 and the information representing the first distance D1 and the second distance D2. The fourth overlap information 262-4 includes the information representing the fourth side S-4 and the information representing the first distance D1.

Similarly to the first embodiment, as aspects of the overlap information in the first modified example, the two alternatives described below can be cited. The first aspect of the overlap information 262 includes just the information representing the side S, the first distance D1 and the second distance D2 if necessary. The second aspect of the overlap information 262 includes the information representing all of the sides of the overlap area DA, and the information representing the first distance D1 and the second distance D2 of each of the sides. When the second distance D2 is unnecessary, the second aspect of the overlap information 262 includes 0 instead of the second distance D2.

Using the example shown in FIG. 12, since the first side S-1 is set to the right side, the first distance D1 is set to 30, and the second distance D2 is unnecessary and is therefore set to 0, the second aspect of the first overlap information 262-1 becomes, for example, "upper side 0, 0, left side 0, 0, right side 30, 0, lower side 0, 0." The second aspect of the fourth overlap information 262-4 becomes the same in content as the second aspect of the first overlap information 262-1. Further, since the second side S-2 is set to the left side, the first distance D1 is set to 30, and the second distance D2 is set to 10, the second aspect of the second overlap information 262-2 becomes, for example, "upper side 0, 0, left side 30, 10, right side 0, 0, lower side 0, 0." The second aspect of the third overlap information 262-3 becomes the same in content as the second aspect of the second overlap information 262-2.

The transmission section 246 transmits the first overlap information 262-1 to the first projector 8-1, the second overlap information 262-2 to the second projector 8-2, the third overlap information 262-3 to the third projector 8-3, and the fourth overlap information 262-4 to the fourth projector 8-4.

The first projector 8-1 projects an image obtained by performing the edge blending process in the first area R-1 of the first image G-1 based on the first image data GD-1 and the first overlap information 262-1. The second projector 8-2 projects an image obtained by performing the edge blending process in the first area R-1 of the second image G-2 based on the second image data GD-2 and the second overlap information 262-2. The third projector 8-3 projects an image obtained by performing the edge blending process in the second area R-2 of the third image G-3 based on the third image data GD-3 and the third overlap information 262-3. The fourth projector 8-4 projects an image obtained by performing the edge blending process in the second area R-2 of the fourth image G-4 based on the fourth image data GD-4 and the fourth overlap information 262-4.

As described hereinabove, in an aspect of the control device 2, the control device 2 communicates with the first projector 8-1, the second projector 8-2, the third projector 8-3 and the fourth projector 8-4, wherein the first projector 8-1 projects the first image G-1 in the first projection area PA-1 of the projection surface SC based on the first image data GD-1, the second projector 8-2 projects the second image G-2 in the second projection area PA-2 having the first overlap area DA-1 overlapping the first projection area PA-1 in the horizontal direction based on the second image data GD-2, the third projector 8-3 projects the third image G-3 in the third projection area PA-3 of the projection surface SC based on the third image data GD-3, and the fourth projector 8-4 projects the fourth image G-4 in the fourth projection area PA-4 having the second overlap area DA-2 overlapping the third projection area PA-3 in the horizontal direction based on the fourth image data GD-4, and thus, the control device 2 makes the first projector 8-1 and the second projector 8-2 perform the edge blending process of adjusting the luminance of the image projected in a part of the first overlap area DA-1, and makes the third projector 8-3 and the fourth projector 8-4 perform the edge blending process of adjusting the luminance of the image projected in a part of the second overlap area DA-2.

Further, the edge blending process is a process of adjusting the luminance of the image projected in the first area R-1 from the start line SL, which is the line parallel to the second side S-2, and determines the starting position, to the first side S-1 of the first projection area PA-1 in the first overlap area DA-1, and the second area R-1 from the start line SL to the fourth side S-4 of the fourth projection area PA-4 in the second overlap area DA-2.

Further, the control device 2 is provided with the reception section 241, the generation section 245 and the transmission section 246. The reception section 241 receives the designation information 261 including the first distance D1 from the start line SL to the first side S-1, the second distance D2 from the second side S-2 to the start line SL, the information representing the direction in which the first projection area PA-1 overlaps the second projection area PA-2, and the information representing the direction in which the third projection area PA-3 overlaps the fourth projection area PA-4. The generation section 245 generates the first overlap information 262-1, the second overlap information 262-2, the third overlap information 262-3 and the fourth overlap information 262-4 based on the designation information 261, wherein the first overlap information 262-1 includes the information representing the first side S-1 of the first projection area PA-1 and the information representing the first distance D1, the second overlap information 262-2 includes the information representing the second side S-2 of the second projection area PA-2 and the information representing the first distance D1 and the second distance D2, the third overlap information 262-3 includes the information representing the third side S-3 of the third projection area PA-3 and the information representing the first distance D1 and the second distance D2, and the fourth overlap information 262-4 includes the information representing the fourth side S-4 of the fourth projection area PA-4 and the information representing the first distance D1. The transmission section 246 transmits the first overlap information 262-1 to the first projector 8-1, the second overlap information 262-2 to the second projector 8-2, the third overlap information 262-3 to the third projector 8-3, and the fourth overlap information 262-4 to the fourth projector 8-4.

Normally, when the projection surface SC has the two projection areas PA arranged in the horizontal direction, and the two projection areas PA arranged in the vertical direction, the user is required to input the first distance D1 and the second distance D2 of the first overlap area DA-1 and the first distance D1 and the second distance D2 of the second overlap area DA-2 when performing the edge blending process of adjusting the luminance of a part of the overlap area DA.

In contrast, according to the aspect described hereinabove, when the user input just the first distance D1 and the second distance D2, the control device 2 sets the first distance D1 and the second distance D2 of the first overlap area DA-1 and the first distance D1 and the second distance D2 of the second overlap area DA-2 in a lump. Therefore, since the user is not required to input the first distance D1 and the second distance D2 of one of the overlap areas DA, the trouble with the input of the setting of the edge blending process of adjusting the luminance of a part of the overlap area DA is reduced, and thus, it becomes possible to shorten the time necessary for the input of the setting of the edge blending process.

C.2. Second Modified Example

The projection surface SC includes the two projection areas PA arranged in the horizontal direction and the two projection areas PA arranged in the vertical direction in the second embodiment and the first modified example, but this is not a limitation. For example, it is also possible for the projection surface SC to have N projection areas PA arranged in the horizontal direction, and M projection areas PA arranged in the vertical direction. The value M is an integer equal to or greater than 1. The value N is also an integer equal to or greater than 1. It should be noted that the values M and N are not set to 1 at the same time. Further, it is also possible to project the confirmation images KG for confirming whether or not the projection areas PA are set correctly.

Figure 13:
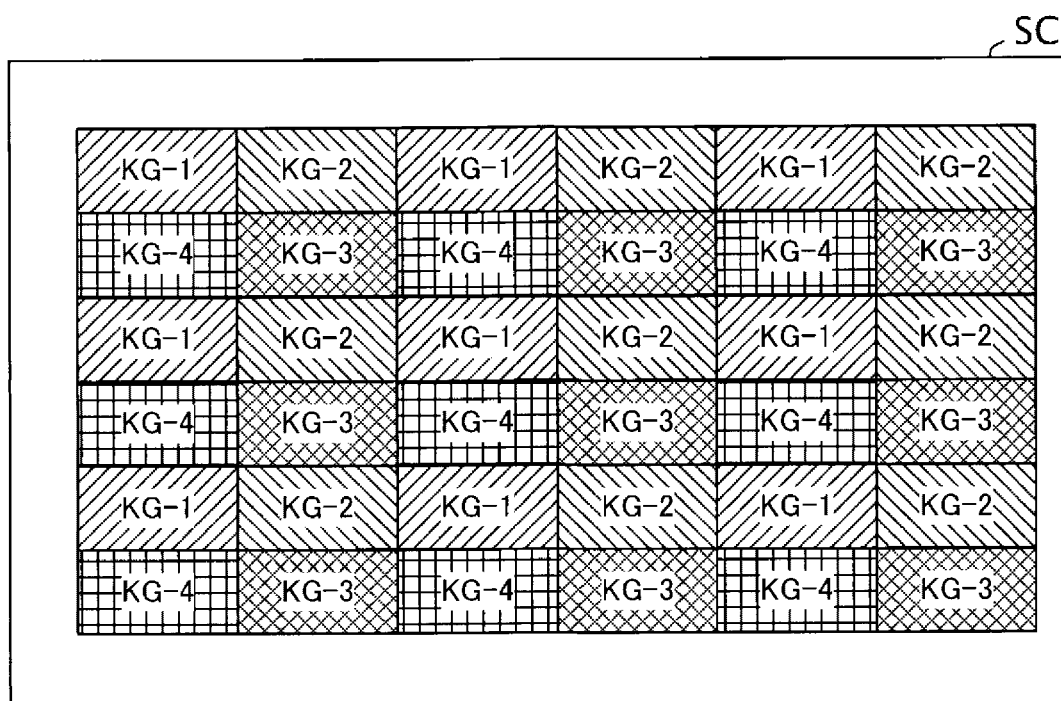
FIG. 13 is a diagram showing an example of projection of confirmation images KG.

FIG. 13 shows an example the projection of the confirmation images KG when M=6 and N=6 are assumed. In FIG. 13, a first color is represented by the hatching with the lines extending from the upper right toward the lower left, a second color is represented by the hatching with lines extending from the upper left toward the lower right, a third color is represented by the hatching like an oblique mesh, and a fourth color is represented by the hatching like a mesh. It should be noted that in FIG. 13, the overlap areas DA are not drawn in order to avoid complication of the drawing.

The transmission section 246 transmits an instruction of projecting the first confirmation image KG-1 to the projectors 8 for projecting the images G in the projection areas PA located in the odd-numbered columns from the end in the negative direction of the X axis and in the odd-numbered rows from the end in the positive direction of the Y axis. Similarly, the transmission section 246 transmits an instruction of projecting the second confirmation image KG-2 to the projectors 8 for projecting the images G in the projection areas PA located in the even-numbered columns from the end in the negative direction of the X axis and in the odd-numbered rows from the end in the positive direction of the Y axis. The transmission section 246 transmits an instruction of projecting the third confirmation image KG-3 to the projectors 8 for projecting the images G in the projection areas PA located in the even-numbered columns from the end in the negative direction of the X axis and in the even-numbered rows from the end in the positive direction of the Y axis. The transmission section 246 transmits an instruction of projecting the fourth confirmation image KG-4 to the projectors 8 for projecting the images G in the projection areas PA located in the odd-numbered columns from the end in the negative direction of the X axis and in the even-numbered rows from the end in the positive direction of the Y axis.

Since the color of the areas where the four overlap areas DA overlap each other becomes white when the projection areas PA are set correctly, it becomes possible for the user to easily identify whether or not the projection areas PA are set correctly.

C.3. Third Modified Example

In the first embodiment, the control device 2 and the image providing device 4 are separate devices, but this is not a limitation. For example, it is also possible for the control device 2 to provide the image data GD to the projectors 8. Further, when providing the image data GD to the projectors 8, it is possible for the control device 2 to perform the edge blending process for the projectors 8. The elements described hereinafter are assumed to be the elements related to the third modified example unless particularly described for the sake of abbreviation of the explanation.

Figure 14:
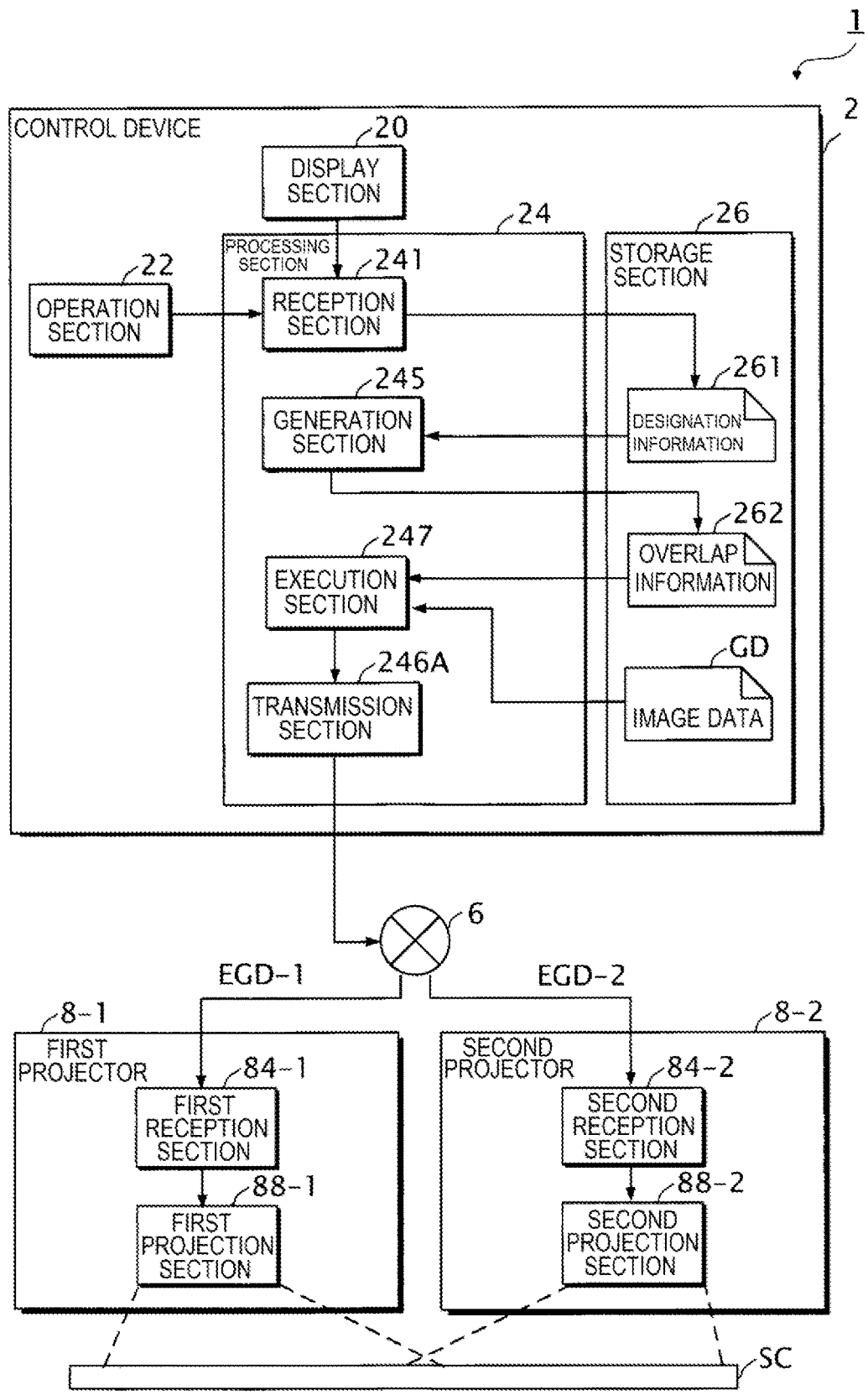
FIG. 14 is a diagram showing a configuration example of a multi-projection system 1 according to a third modified example.

FIG. 14 shows a configuration example of the multi-projection system 1. The storage section 26 stores the first image data GD-1 and the second image data GD-2. In FIG. 14, in order to avoid complication of the drawing, the image data GD is described as a representative of the first image data GD-1 and the second image data GD-2. The processing section 24 retrieves and then executes a program stored in the storage section 26 to thereby be provided with the reception section 241, the generation section 245, an execution section 247 and a transmission section 246A.

The execution section 247 performs the edge blending process in a part or the whole of the first overlap area DA-1 of the first image G-1 based on the first image data GD-1 and the first overlap information 262-1, and performs the edge blending process in a part or the whole of the first overlap area DA-1 of the second image G-2 based on the second image data GD-2 and the second overlap information 262-2.

The transmission section 246A transmits first edge blending image data EGD-1 representing an image, which is obtained by performing the edge blending process in a part or the whole of the first overlap area DA-1 of the first image G-1, to the first projector 8-1. Further, the transmission section 246A transmits second edge blending image data EGD-1 representing an image, which is obtained by performing the edge blending process in a part or the whole of the first overlap area DA-1 of the second image G-2, to the second projector 8-2.

The first projector 8-1 has the first reception section 84-1 and the first projection section 88-1. The first reception section 84-1 receives the first edge blending image data EGD-1 from the control device 2. The first projection section 88-1 projects the image represented by the first edge blending image data EGD-1.

The second projector 8-2 has the second reception section 84-2 and the second projection section 88-2. The second reception section 84-2 receives the second edge blending image data EGD-2 from the control device 2. The second projection section 88-2 projects the image represented by the second edge blending image data EGD-2.

As described hereinabove, in an aspect of the multi-projection system 1, the multi-projection system 1 includes the first projector 8-1, the second projector 8-2 and the control device 2, wherein the first projector projects the first image G-1 in the first projection area PA-1 of the projection surface SC based on the first image data GD-1, the second projector 8-2 projects the second image G-2 in the second projection area PA-2 having the first overlap area DA-1 overlapping the first projection area PA-1 based on the second image data GD-2, and the control device 2 makes the first projector 8-1 and the second projector 8-2 perform the edge blending process for adjusting the luminance of the image projected in apart or the whole of the first overlap area DA-1.

Further, the control device 2 is provided with the reception section 241, the generation section 245, the execution section 247 and the transmission section 246A. The reception section 241 receives input of the storage section 26 storing the first image data GD-1 and the second image data GD-2, and the designation information 261 including the information representing the direction in which the first projection area PA-1 overlaps the second projection area PA-2, and the width of the first overlap area. Based on the designation information 261, the generation section 245 generates the first overlap information 262-1 including the information representing the first side S-1 of the first projection area PA-1 included in the first overlap area DA-1 and the information representing the width of the first overlap area DA-1, and the second overlap information 262-2 including the information representing the second side S-2 of the second projection area PA-2 included in the first overlap area DA-1 and the information representing the width of the first overlap area DA-1. The execution section 247 performs the edge blending process in a part or the whole of the first overlap area DA-1 of the first image G-1 based on the first image data GD-1 and the first overlap information 262-1, and performs the edge blending process in a part or the whole of the first overlap area DA-1 of the second image G-2 based on the second image data GD-2 and the second overlap information 262-2. The transmission section 246A transmits the first edge blending image data EGD-1 representing the image obtained by performing the edge blending process in a part or the whole of the first overlap area DA-1 of the first image G-1 to the first projector 8-1, and transmits the second edge blending image data EGD-2 representing the image obtained by performing the edge blending process in a part or the whole of the first overlap area DA-1 of the second image G-2 to the second projector 8-2.

The first projector 8-1 is provided with the first projection section 88-1 for projecting the image represented by the first edge blending image data EGD-1.

The second projector 8-2 is provided with the second projection section 88-2 for projecting the image represented by the second edge blending image data EGD-2.

According to the aspect described hereinabove, since the user is not required to input the overlap width of one of the overlap areas PA and the sides requiring the edge blending process, the trouble with the input of the setting of the edge blending process is reduced, and it becomes possible to shorten the time necessary for the input of the setting of the edge blending process. Further, since the control device 2 performs the edge blending process for the projectors 8, it becomes possible to suppress the load on the projectors 8.

C.4. Other Modified Examples

The edge blending process of adjusting the luminance of the whole of the overlap area DA is performed in the first embodiment, but this is not a limitation. For example, it is also possible for the execution section 861 to perform the edge blending process on a predetermined proportion to the overlap width included in the overlap information 262. It is possible for the control device 2 to inform the projectors 8 of the predetermined proportion in advance, or it is possible for the projectors 8 to store the predetermined proportion in advance in shipping.

In the edge blending process, it is possible to perform a pixel adjustment for adjust the shape of the overlap area DA in addition to the adjustment of the luminance of the image to be projected in a part or the whole of the overlap area DA.

In the second embodiment, red is an example of the first color, green is an example of the second color, and blue is an example of the third color, but this is not a limitation. For example, green or blue can also be used as the first color.

In each of the embodiments described above, the horizontal direction is an example of the first direction, and the vertical direction is an example of the second direction, but this is not a limitation. For example, it is also possible to define the vertical direction as the first direction, and the horizontal direction as the second direction. Alternatively, it is also possible to define a direction rotated counterclockwise as much as θ from the positive direction of the X axis as the first direction, and a direction rotated counterclockwise as much as θ+90 degrees from the positive direction of the X axis as the second direction. The angle θ is a real number no smaller than 0 and smaller than 360 degrees. Alternatively, it is also possible for the first direction and the second direction not to be perpendicular to each other, but simply differ from each other.

In each of the embodiments described above, the shape of the projection area PA shown in FIG. 1 and so on is a rectangular shape, but is not limited to a rectangular shape. For example, the shape of the projection area PA can also be a parallelogram or a trapezoidal shape, and is only required to be an arbitrary quadrangular shape. Further, the sides of the projection area PA are each a straight line in FIG. 1, but can also be a curved line. Further, the shapes of the projection areas PA can be the same, or can also be different from each other.

In each of the embodiments described above, the projection surface SC shown in FIG. 2 and so on is a plane surface, but can also be a curved surface. Further, it is also possible for the projection areas PA to overlap each other to form a ring. For example, it is assumed that the multi-projection system 1 has the first projector 8-1 through an L-th projector 8-L. The value L is an integer equal to or greater than 2. The projection surface SC includes the first projection area PA-1 through a projection area PA-L. The projection areas PA overlap along the horizontal direction. Then, the right side of the projection area PA-i overlaps the left side of the projection area PA-(i+1). The value i is an integer in a range from 1 to L-1. In this case, it is possible for the right side of the projection area PA-L to overlap the left side of the first projection area PA-1.

In the projection section 88 in each of the embodiments described above, the liquid crystal light valves are used as the light modulation device, but the light modulation device is not limited to the liquid crystal light valves, and can arbitrarily be changed. For example, it is also possible for the light modulation device to have a configuration using three reflective liquid crystal panels. Further, it is also possible for the light modulation device to have a configuration such as a system using a single liquid crystal panel, a system using three digital mirror devices (DMD), or a system using a single digital mirror device. When just one liquid crystal panel or DMD is used as the light modulation device, the members corresponding to the color separation optical system and the color combining optical system are unnecessary. Further, besides the liquid crystal panel or the DMD, any configurations capable of modulating the light emitted by the light source can be adopted as the light modulation device.

In each of the aspects described above, some or all of the elements realized by the processing section 24 executing the program can also be realized by hardware using an electronic circuit such as a FPGA (field programmable gate array) or an ASIC (application specific IC), or can also be realized by a cooperative operation of software and hardware. Further, the present disclosure is specified as a control method of the control device 2 according to each of the aspects described above.

What is claimed is:
1. A control method of a control device configured to communicate with a first projector and a second projector, the method comprising:
  receiving, by the control device, input of designation information including information representing a direction in which a first projection area overlaps a second projection area, and information representing a width of a first overlap area;
  displaying, by the control device, a preview image shows an area of an edge blending process in a case of performing the edge blending process based on the designation information,
  generating, by the control device, first overlap information including information representing a first side of the first projection area included in the first overlap area and the information representing the width of the first overlap area, and second overlap information including information representing a second side of the second projection area included in the first overlap area and the information representing the width of the first overlap area based on the designation information;
  making the first projector project a first image which is obtained by performing the edge blending process based on the first overlap information; and
  making the second projector project a second image which is obtained by performing the edge blending process based on the second overlap information, wherein
  the first projector projects the first image in the first projection area of a projection surface, and the second projector projects the second image in the second projection area having the first overlap area overlapping the first projection area.
2. The control method according to claim 1, wherein
  the first projection area and the second projection area overlap each other in one of a first direction and a second direction different from the first direction,
  when the first projection area and the second projection area overlap in the first direction, the designation information includes information representing a width in the first direction of the first overlap area, and
  when the first projection area and the second projection area overlap in the second direction, the designation information includes information representing a width in the second direction of the first overlap area.

3. The control method according to claim 1, wherein
the control device communicates with a third projector which projects a third image in a third projection area of the projection surface, and a fourth projector which projects a fourth image in a fourth projection area having a second overlap area overlapping the third projection area in a first direction to make the third projector and the fourth projector perform an edge blending process of adjusting a luminance of an image projected in one of a part and a whole of the second overlap area,
the first projection area and the second projection area overlap each other in the first direction,
the designation information includes information representing a direction in which the third projection area overlaps the fourth projection area,
the control device generates third overlap information including information representing a third side of the third projection area included in the second overlap area and information representing a width in the first direction of the first overlap area, and fourth overlap information including information representing a fourth side of the fourth projection area included in the second overlap area and information representing the width in the first direction of the first overlap area based on the designation information,
the control device making the third projector project the third image which is obtained by performing the edge blending process based on the third overlap information, and
the control device making the fourth projector project the fourth image which is obtained by performing the edge blending process based on the fourth overlap information.

4. The control method according to claim 3, wherein
the second projection area and the third projection area overlap each other in a second direction different from the first direction, and the first projection area and the fourth projection area overlap each other in the second direction,
the designation information includes information representing a direction in which the second projection area overlaps the third projection area, information representing a direction in which the first projection area overlaps the fourth projection area, and information representing a width in the second direction of the third overlap area in which the second projection area and the third projection area overlap each other,
the first overlap information includes information representing a seventh side of the first projection area included in a fourth overlap area in which the first projection area and the fourth projection area overlap each other, and information representing a width in the second direction of the third overlap area,
the second overlap information includes information representing a fifth side of the second projection area included in the third overlap area, and information representing the width in the second direction of the third overlap area,
the third overlap information includes information representing a sixth side of the third projection area included in the third overlap area, and information representing the width in the second direction of the third overlap area, and
the fourth overlap information includes information representing an eighth side of the fourth projection area included in the fourth overlap area, and information representing the width in the second direction of the third overlap area.

5. The control method according to claim 4, wherein
the control device transmits an instruction of projecting an image of a first color of light's three primary colors to the first projector, an instruction of projecting an image of a second color of the light's three primary colors to the second projector, an instruction of projecting an image of a fourth color obtained by additive color mixing of the first color and a third color of the light's three primary colors to the third projector, and an instruction of projecting an image of a fifth color obtained by additive color mixing of the second color and the third color to the fourth projector.

6. A control method of a control device configured to communicate with a first projector, a second projector, a third projector and a fourth projector, the control method comprising:
receiving, by the control device, input of designation information including a first distance from the start line to the first side, a second distance from the second side to the start line, information representing a direction in which a first projection area overlaps a second projection area, and information representing a direction in which a third projection area overlaps a fourth projection area;
generating, by the control device, first overlap information including information representing the first side of the first projection area and information representing the first distance, second overlap information including information representing the second side of the second projection area and information representing the first distance and the second distance, third overlap information including information representing the third side of the third projection area and information representing the first distance and the second distance, and fourth overlap information including information representing the fourth side of the fourth projection area and the information representing the first distance based on the designation information; and
making the first projector project a first image which is obtained by performing the edge blending process based on the first overlap information;
making the second projector project a second image which is obtained by performing the edge blending process based on the second overlap information;
making the third projector project a third image which is obtained by performing the edge blending process based on the third overlap information; and
making the fourth projector project a fourth image which is obtained by performing the edge blending process based on the fourth overlap information, wherein
the first projector which projects the first image in the first projection area of a projection surface, the second projector which projects the second image in the second projection area having a first overlap area overlapping the first projection area in a first direction, the third projector which projects the third image in the third projection area of the projection surface, and the fourth projector which projects the fourth image in the fourth projection area having a second overlap area overlapping the third projection area in the first direction.

7. The control method according to claim 1, further comprising:
  to the control device displays a first simulant image simulating the first projection area, and a second simulant image simulating the second projection area, wherein
  the control device receives input of a move operation of the first simulant image and the second simulant image and input of a width of the first overlap area, and receives identifying the overlapping direction based on the input of the move operation of the first simulant image and the second simulant image to generate the designation information including information representing the overlapping direction identified and information representing the width of the first overlap area as input of the designation information.

* * * * *